US009751755B2

(12) United States Patent
Mardilovich et al.

(10) Patent No.: US 9,751,755 B2
(45) Date of Patent: Sep. 5, 2017

(54) METHOD OF FORMING A MICRO-STRUCTURE

(75) Inventors: Peter Mardilovich, Corvallis, OR (US); Anthony M. Fuller, Corvallis, OR (US); Qingqiao Wei, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 96 days.

(21) Appl. No.: 13/825,029

(22) PCT Filed: Oct. 21, 2010

(86) PCT No.: PCT/US2010/053581
§ 371 (c)(1),
(2), (4) Date: Mar. 19, 2013

(87) PCT Pub. No.: WO2012/054044
PCT Pub. Date: Apr. 26, 2012

(65) Prior Publication Data
US 2013/0177738 A1    Jul. 11, 2013

(51) Int. Cl.
*C25D 11/26*   (2006.01)
*B81C 1/00*    (2006.01)
(Continued)

(52) U.S. Cl.
CPC ............ *B81C 1/00373* (2013.01); *B81B 3/00* (2013.01); *B81C 1/00031* (2013.01);
(Continued)

(58) Field of Classification Search
CPC .. B81B 2201/0214; C25D 1/00; C25D 1/003; C25D 1/006; C25D 1/02; C25D 1/04; C25D 11/045
(Continued)

(56) References Cited

U.S. PATENT DOCUMENTS

| 4,975,175 A * | 12/1990 | Karube | C12Q 1/005 |
| | | | 204/403.12 |
| 5,581,091 A * | 12/1996 | Moskovits | B82Y 10/00 |
| | | | 205/153 |

(Continued)

FOREIGN PATENT DOCUMENTS

| CA | 2137013 | 11/1994 |
| CN | 101255588 | 9/2008 |

(Continued)

OTHER PUBLICATIONS

Dye Solar Cells for Real, 2012, Solaronix. Retrieved from http://www2.mpip-mainz.mpg.de/~canovas/dye_solar_cells_for_real.pdf.*

(Continued)

*Primary Examiner* — Aaron Austin
*Assistant Examiner* — Zheren J Yang
(74) *Attorney, Agent, or Firm* — Dierker & Kavanaugh, P.C.

(57) ABSTRACT

A method of forming a micro-structure involves forming a multi-layered structure including i) an oxidizable material layer on a substrate and ii) another oxidizable material layer on the oxidizable material layer. The oxidizable material layer is formed of an oxidizable material having an expansion coefficient, during oxidation, that is more than 1. The method further involves forming a template, including a plurality of pores, from the other oxidizable material layer, and growing a nano-pillar inside each pore. The nano-pillar has a predefined length that terminates at an end. A portion of the template is selectively removed to form a substantially even plane that is oriented in a position opposed to the substrate. A material is deposited on at least a portion of the plane to form a film layer thereon, and the remaining portion (Continued)

of the template is selectively removed to expose the nanopillars.

13 Claims, 16 Drawing Sheets

(51) Int. Cl.
*C25D 1/00* (2006.01)
*C25D 11/18* (2006.01)
*B81B 3/00* (2006.01)
*C25D 11/02* (2006.01)
*C25D 11/04* (2006.01)
*C25D 11/08* (2006.01)
*C25D 11/10* (2006.01)

(52) U.S. Cl.
CPC ............ *C25D 1/006* (2013.01); *C25D 11/022* (2013.01); *C25D 11/045* (2013.01); *C25D 11/08* (2013.01); *C25D 11/10* (2013.01); *C25D 11/18* (2013.01); *C25D 11/26* (2013.01); *Y10S 977/856* (2013.01); *Y10S 977/888* (2013.01); *Y10T 428/24355* (2015.01)

(58) Field of Classification Search
USPC .................... 977/957, 958; 216/19
See application file for complete search history.

(56) References Cited

U.S. PATENT DOCUMENTS

| | | | |
|---|---|---|---|
| 6,359,288 B1 | 3/2002 | Ying et al. | |
| 6,610,463 B1* | 8/2003 | Ohkura | H01L 21/0275 257/2 |
| 6,914,008 B2 | 7/2005 | Den et al. | |
| 6,972,146 B2* | 12/2005 | Den | C22C 30/00 205/324 |
| 6,982,217 B2 | 1/2006 | Imada et al. | |
| 7,079,250 B2* | 7/2006 | Mukai | G01N 21/554 257/226 |
| 7,192,510 B2 | 3/2007 | Den et al. | |
| 7,208,077 B1 | 4/2007 | Albers et al. | |
| 7,265,375 B2 | 9/2007 | Zhang et al. | |
| 7,267,859 B1 | 9/2007 | Rabin et al. | |
| 7,322,871 B2* | 1/2008 | Lambertini | H01K 1/02 313/341 |
| 7,381,658 B2* | 6/2008 | Mardilovich | B81B 1/00 438/758 |
| 7,517,554 B2 | 4/2009 | Saito et al. | |
| 7,569,905 B2 | 8/2009 | Hantschel et al. | |
| 7,572,669 B2 | 8/2009 | Tuominen et al. | |
| 7,594,982 B1 | 9/2009 | Roscheisen et al. | |
| 7,686,885 B2 | 3/2010 | Ku et al. | |
| 7,790,469 B2* | 9/2010 | Wang | G01J 3/44 356/301 |
| 2002/0090649 A1* | 7/2002 | Chan et al. | 435/7.1 |
| 2002/0121851 A1* | 9/2002 | Yasui | H01J 9/025 313/310 |
| 2004/0053167 A1 | 3/2004 | Hotta | |
| 2004/0157358 A1 | 8/2004 | Hiramatsu et al. | |
| 2004/0201042 A1 | 10/2004 | Den | |
| 2005/0205903 A1* | 9/2005 | Hioki | H01L 27/14647 257/291 |
| 2005/0224360 A1* | 10/2005 | Varghese | B82Y 30/00 205/171 |
| 2006/0024193 A1* | 2/2006 | Zhao | C01B 3/0031 420/528 |
| 2006/0088993 A1* | 4/2006 | Zhang | B81C 1/00111 438/618 |
| 2006/0134883 A1* | 6/2006 | Hantschel | B82Y 10/00 438/458 |
| 2006/0138394 A1* | 6/2006 | Den | B81B 1/002 257/3 |
| 2006/0229715 A1* | 10/2006 | Istephanous | A61F 2/0077 623/1.46 |
| 2006/0269797 A1* | 11/2006 | Lu | G11B 5/72 428/834 |
| 2006/0270229 A1* | 11/2006 | Corderman | B82Y 10/00 438/689 |
| 2007/0031639 A1 | 2/2007 | Hsu et al. | |
| 2007/0032076 A1* | 2/2007 | Lee | H01L 33/20 438/666 |
| 2007/0054421 A1* | 3/2007 | Ueda | B82Y 10/00 438/3 |
| 2007/0113530 A1 | 5/2007 | Morozov et al. | |
| 2007/0118939 A1* | 5/2007 | Repetto | C25D 11/12 438/706 |
| 2007/0187238 A1* | 8/2007 | Whalen, III | A61B 5/04001 204/400 |
| 2007/0187840 A1* | 8/2007 | Dell'Acqua-Bellavitis | A61B 5/00 257/784 |
| 2007/0229817 A1* | 10/2007 | Wang | G01N 21/658 356/301 |
| 2007/0235342 A1 | 10/2007 | Matsuo et al. | |
| 2007/0264749 A1* | 11/2007 | Birkmeyer | B81C 1/00111 438/106 |
| 2008/0037173 A1* | 2/2008 | Saito | B82Y 10/00 360/135 |
| 2008/0047604 A1* | 2/2008 | Korevaar | B82Y 20/00 136/258 |
| 2008/0116168 A1 | 5/2008 | Samper et al. | |
| 2008/0218740 A1* | 9/2008 | Williams | B82Y 20/00 356/72 |
| 2008/0223794 A1* | 9/2008 | Yamamichi | B01J 20/28014 210/767 |
| 2008/0272421 A1* | 11/2008 | Bhat | H01G 4/1254 257/310 |
| 2008/0274359 A1 | 11/2008 | Lawrence et al. | |
| 2008/0277746 A1* | 11/2008 | Hsu | B81C 1/00095 257/414 |
| 2008/0318003 A1* | 12/2008 | Chua | B82Y 10/00 428/141 |
| 2009/0034122 A1* | 2/2009 | Ichihara | B82Y 10/00 360/131 |
| 2009/0045720 A1 | 2/2009 | Lee et al. | |
| 2009/0214942 A1* | 8/2009 | Frank | H01G 9/048 429/122 |
| 2009/0220561 A1* | 9/2009 | Jin | A61K 9/0009 424/423 |
| 2009/0243584 A1* | 10/2009 | Zhang | B81C 1/00031 324/71.1 |
| 2009/0266418 A1 | 10/2009 | Hu et al. | |
| 2009/0297913 A1* | 12/2009 | Zhang | H01M 4/92 429/499 |
| 2009/0311516 A1* | 12/2009 | Wei | C25D 11/04 428/335 |
| 2010/0033059 A1* | 2/2010 | Choi | H01L 41/37 310/339 |
| 2010/0047523 A1 | 2/2010 | Kim et al. | |
| 2010/0065735 A1* | 3/2010 | Murakami | H01J 49/0418 250/282 |
| 2010/0066346 A1* | 3/2010 | Zhang | B81C 1/00166 324/71.1 |
| 2010/0108132 A1* | 5/2010 | Tsakalakos | B81B 1/00 136/256 |
| 2010/0132772 A1 | 6/2010 | Asano et al. | |
| 2010/0187172 A1* | 7/2010 | Paulose | B82Y 30/00 210/506 |
| 2010/0269894 A1* | 10/2010 | Misra | B82Y 20/00 136/252 |
| 2010/0291385 A1* | 11/2010 | Greer | B81C 1/00031 428/398 |
| 2010/0303722 A1* | 12/2010 | Jin | A61L 27/30 424/9.1 |
| 2010/0314617 A1* | 12/2010 | Ito | B81C 1/00111 257/43 |
| 2011/0012103 A1* | 1/2011 | Yang | H01L 21/02554 257/43 |

(56) References Cited

U.S. PATENT DOCUMENTS

| | | | |
|---|---|---|---|
| 2011/0030382 A1* | 2/2011 | Eadon | B01D 53/22 60/780 |
| 2011/0174069 A1* | 7/2011 | Cornelius | B01J 19/0093 73/204.23 |
| 2011/0240346 A1* | 10/2011 | Kang | H05K 3/445 174/257 |
| 2011/0284381 A1* | 11/2011 | Cabot | C23C 8/02 205/50 |
| 2011/0311800 A1* | 12/2011 | Yamashita | C25D 11/20 428/304.4 |
| 2012/0318675 A1* | 12/2012 | Guillet | B82Y 30/00 205/122 |
| 2013/0161614 A1* | 6/2013 | Tiwari | C25D 5/02 257/43 |
| 2014/0011020 A1* | 1/2014 | Mertens | C09J 5/02 428/328 |

FOREIGN PATENT DOCUMENTS

| | | |
|---|---|---|
| JP | 05210245 | 8/1993 |
| JP | 08296060 | 11/1996 |
| JP | 10147898 | 6/1998 |
| JP | 2000035687 | 2/2000 |
| JP | 2003011099 | 1/2003 |
| JP | 2004098386 | 4/2004 |
| JP | 2004130171 | 4/2004 |
| JP | 2008156705 | 7/2006 |
| JP | 2006520697 | 9/2006 |
| JP | 2006326723 | 12/2006 |
| JP | 2007098563 | 4/2007 |
| JP | 2007098563 A * | 4/2007 |
| JP | 2009037706 | 2/2009 |
| JP | 2009224146 | 10/2009 |
| KR | 100834896 | 4/2004 |
| WO | WO2009115230 | 9/2009 |

OTHER PUBLICATIONS

Gokdemir et al., "Formation of TiO2 Thin Films by a Modified Sol-gel Route and Characterization of Structural, Optical and Electrochromic Properties," Advanced Material Letters, 2014.*

Furneaux, et al., "The Formation of Controlled-Porosity Membranes From Anodically Oxidized Aluminum", Nature, vol. 337, Jan. 12, 1989, pp. 147-149.

Mardilovich et al., "Electrochemical Fabrication of Nanodimensional Multilayer Films", Nano Letters (2005), vol. 5, No. 10, pp. 1899-1904.

Mardilovich, et al. "Hybrid Micromachining and Surface Microstructuring of Alumina Ceramic", Proc. Electrochem. Society, 2000-19, pp. 33-42.

Masuda et al., "Highly Ordered Nanochannel-Array Architecture in Anodic Alumina", Appl. Phys. Lett. 71 (19), Nov. 10, 1997, pp. 2770-2772.

Mozalev et al., "Nucleation and Growth of the Nanostructured Anodic Oxides on Tantalum and Niobium Under the Porous Alumina Film", Electrochimica Acta 48 (2003), pp. 3155-3170.

Mozalev et al., "Structure, Morphology, and Dielectric Properties of Nanocomposite Oxide Films Formed by Anodizing of Sputter-Deposited Ta—Al Bilayers", J of Electrochem Society, 151(11), 2004, pp. E257-E268.

Fang, et al.; "Nanoimprinted SU-8 Nanopillars and Hierarchically Branched Nanowires by Anodic Aluminum Oxide Templates and Their Optical Properties"; Conference Proceeding of Micro/Nano Symposium (UGIM), 2010 ISth Biennial.

Kuo et al., "Sub-10nm Fabrication of Large Area Periodic Nanopillars", Mat. Res. Soc. Symp. Proc. vol. EXS-2 (2004), pp. M511.1-M511.3.

Kwon et al.; "Simple Fabrication Method of Hierarchical Nano-Pillars Using Aluminum Anodizing Processes"; Current Applied Physics, Mar. 13, 2009, vol. 9, pp. e81-e85.

Lee, et al.; "Fabrication of Polymer Micro/Nano-Hybrid Lens Array by Microstructured Anodic Aluminum Oxide (AAO) Mold"; Microelectronic Engineering; Dec. 9, 2008. vol. 86, pp. 857-860.

Lin, et al.; "Microwatt MOSLED Using SiOx With Buried Si Nanocrystals on Si Nano-Pillar Array"; Journal of Lightwave Technology; Jun. 1, 2008, vol. 26; No. 11; pp. 1486-1491.

Mozalev, et al., "The growth and electrical transport properties of self-organized metal-oxide nanostructures formed by anodizing Ta—Al thin-film bilayers", Journal of Materials Science, 40, 2005, pp. 6399-6407.

Takahashi, et al., "Anodic film growth on Al layers and Ta-Al metal bilayers in citric acid electrolytes", Electrochimica Acta, 2005, p. 5065-5075.

Kiether, William Jay, "Application of Sculptured Thin Film Technology to Metal Oxide Gas Sensors," doctoral dissertation, 2007. Retrieved from http://repository.lib.ncsu.edu/ir/handle/1840.16/3698.

Lin. G.-R. et al.; "Improving Carrier Transport and Light Emission in a Silicon-Nanocrystal Based MOS Light-Emitting Diode on Silicon Nanopillar Array"; Applied Physics Letters; Aug. 29, 2007 vol. 91, pp. 093122-1 to 093122-3.

Sjostrom T et al: "A study on the formation of titania nanopillars during porous anodic alumina through-mask anodization of Ti substrates", Electrochimica Acta, Elsevier science publishers, barking, GB, vol. 56, No. 1, Sep. 17, 2010 (Sep. 17, 2010), pp. 203-210, XP027484731.

Vorobyova A I et al: "Study of pillar microstructure formation with anodic oxides", Thin solid films, Elsevier, Amsterdam, NL, vol. 324, No. 1-2,, Jul. 1, 1993 (Jul. 1, 1998), pp. 1 10 XP004147793.

* cited by examiner

Aluminum
Anodization

Complete Aluminum Anodization
and Initial Tantalum Anodization

→ To Fig 1D
Continued
Tantalum Anodization

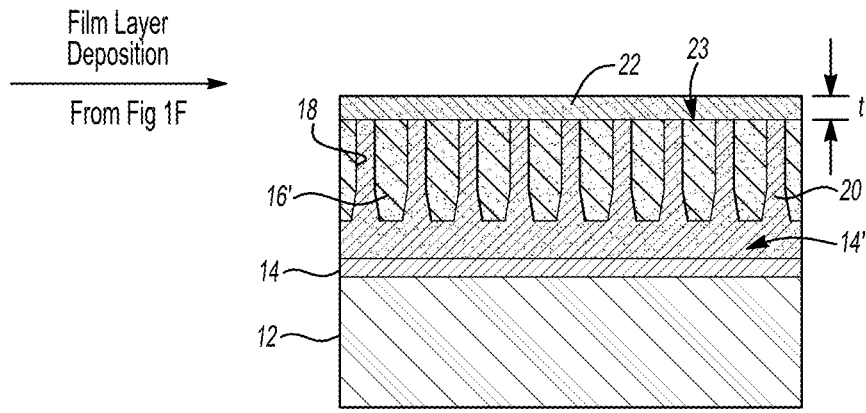
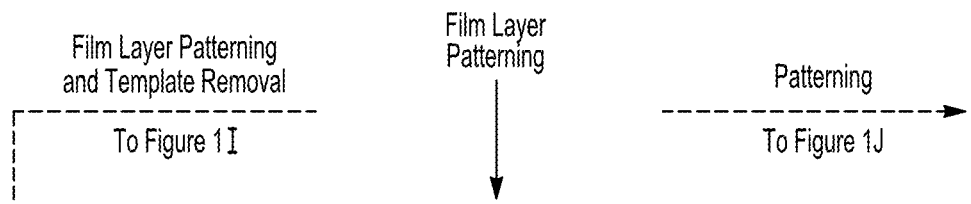
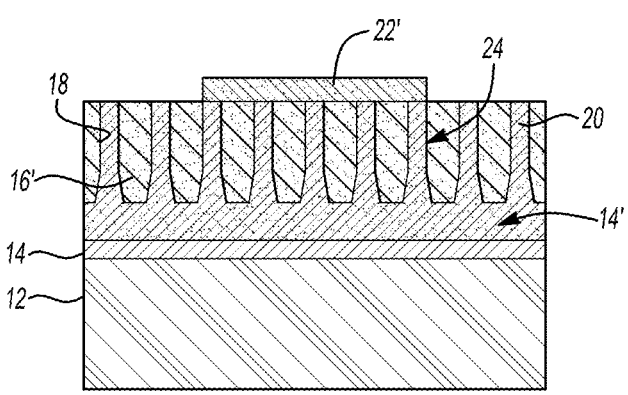
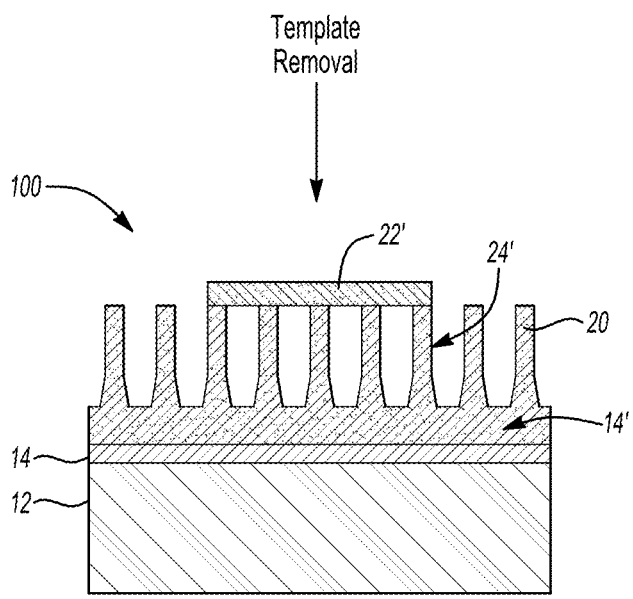

METHOD OF FORMING A MICRO-STRUCTURE

BACKGROUND

The present disclosure relates generally to methods of forming a micro-structure.

Porous anodic oxide structures may be used in a variety of applications including, but not limited to, micro- and nano-electronics (such as, e.g., in planarized aluminum interconnections, precision thin-film resistors, thin-film capacitors, and nano-structured field-emission cathodes), electrostatic and thermo-activated switching devices, LC high-frequency oscillators, AC amplifiers, triggers and other logic vacuum integrated circuits (VICs), gas micro- and nano-sensors, micro- and nano-channel plates, mesoscopic engines, wavelength-sensitive filters, reflective and absorbing surfaces, membranes, nozzles, precision apertures, and/or like. These anodic oxide structures may also include one or more arrays of nano-pores that are used, for example, to form structures having one or more arrays of nano-pillars formed on and supported by a substrate. In some cases, the structures may be insensitive to vibration (i.e., brittle). This may be due, at least in part, to a lack of internal structural flexibility of the structures themselves.

BRIEF DESCRIPTION OF THE DRAWINGS

Features and advantages of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIGS. 1A through 1I together schematically depict an embodiment of a method of forming an embodiment of a micro-structure;

FIGS. 1A through 1G, 1J, and 1K together schematically depict another embodiment of the method of forming another embodiment of a micro-structure;

DETAILED DESCRIPTION

Embodiment(s) of the method disclosed herein may be used to form a micro-structure having an internal structure that is flexible enough so that the micro-structure may suitably be used as a shock absorber, a sensor, and/or the like. Devices made with or incorporating the micro-structure disclosed herein are considered to be robust, at least in part because of the built in shock absorbing property of the nano-structure. This is due, at least in part, to the fact that the weakest part of the structure, i.e., the nano-pillars, are built from amorphous oxide (i.e., no microcrystals with grain boundaries) and are built from the same material as the underlying support (i.e., no interfaces are present between the nano-pillars and the underlying dense oxide). As such, when exposed to external forces (e.g., mechanical pressure) the nano-pillars bend rather than break.

The micro-structure disclosed herein may include components that are on the micro-scale (i.e., from 1 μm to 1000 μm) and components that are on the nano-scale (i.e., from 1 nm to 1000 nm). In some cases, the micro-structure may also be used as a micro- or nano-fluidic device. As used herein, a "microfluidic device" refers to a device for capturing or separating micrometer-sized or smaller particulates within a fluid sample, whereas a "nanofluidic device" refers to a device for capturing or separating nanometer-sized or smaller particulates within a fluid sample. Examples of micro- or nano-fluidic devices include lab-on-a-chip devices, devices for the detection of an analyte, filtration devices, and/or devices for separation of fluidic media.

Briefly, the micro-structure formed by embodiment(s) of the method disclosed herein includes a plurality of micro-islands supported by a set of nano-pillars. As used herein, a "micro-island" is a dense or non-porous film or layer established on a pre-designated set of nano-pillars. The combination of the micro-island and the set of nano-pillars upon which the micro-island is formed may be referred to herein as a "micro-cluster". In some instances, the term micro-cluster may be used interchangeable with the term "multi-legged table structure".

Figure 1A:
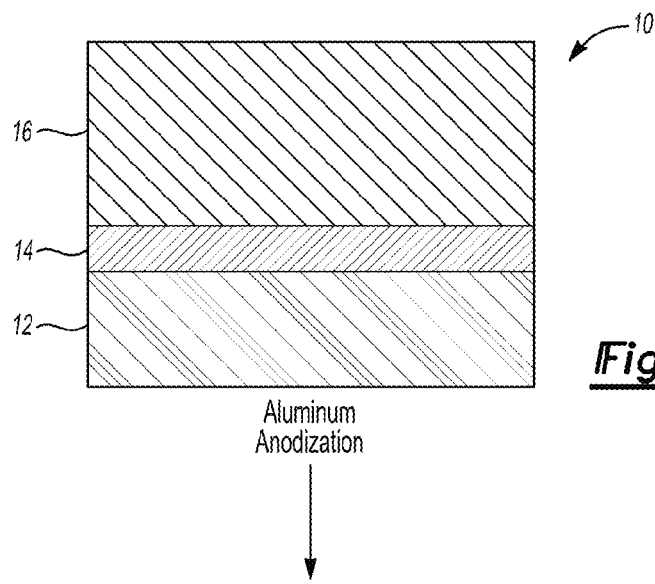
Figure 1B:
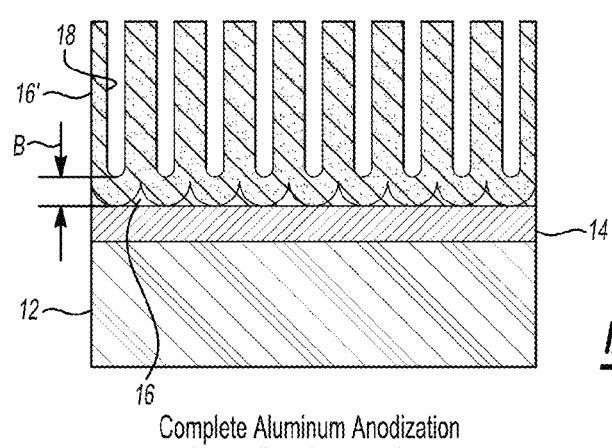
Figure 1C:
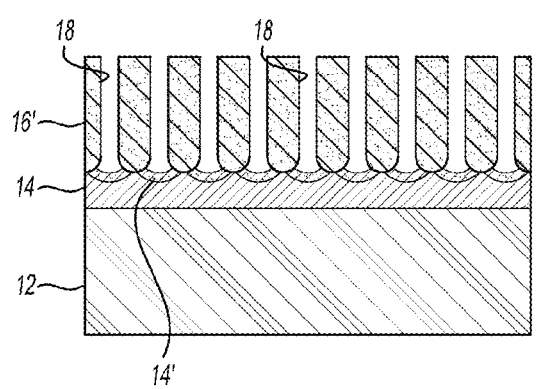
Figure 1D:
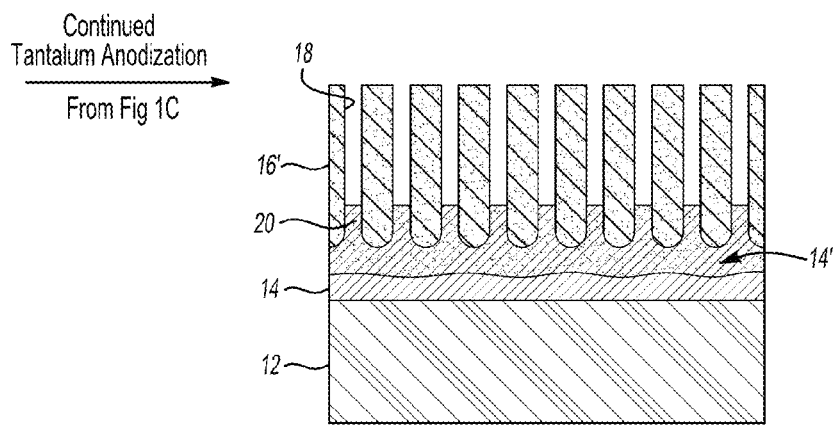
Figure 1E:
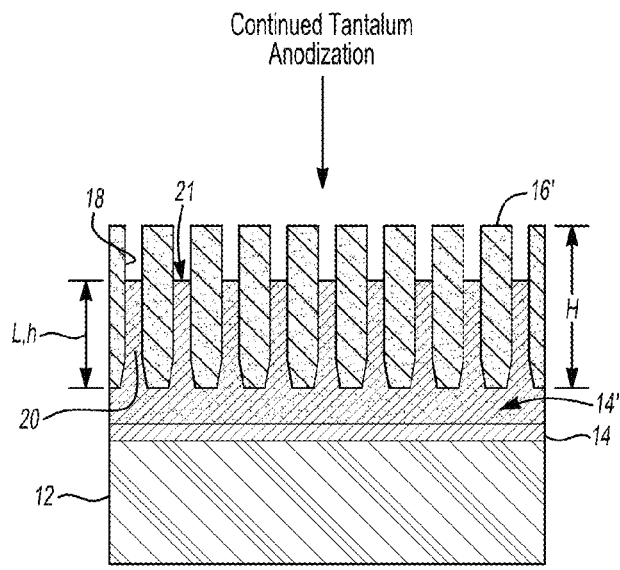
Figure 1F:
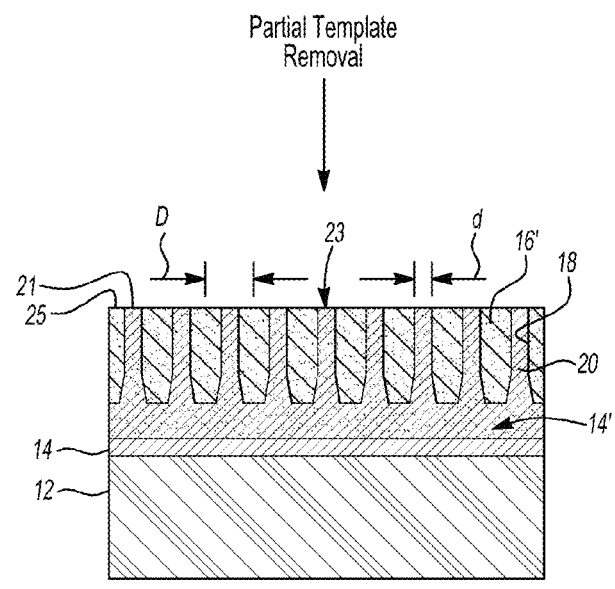
Figure 1J:
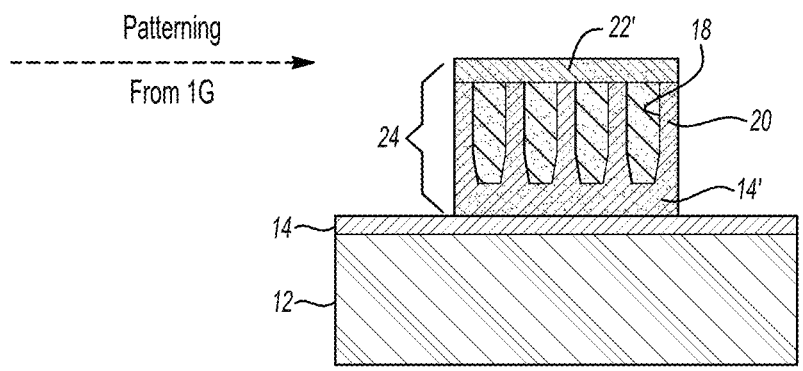
Figure 1K:
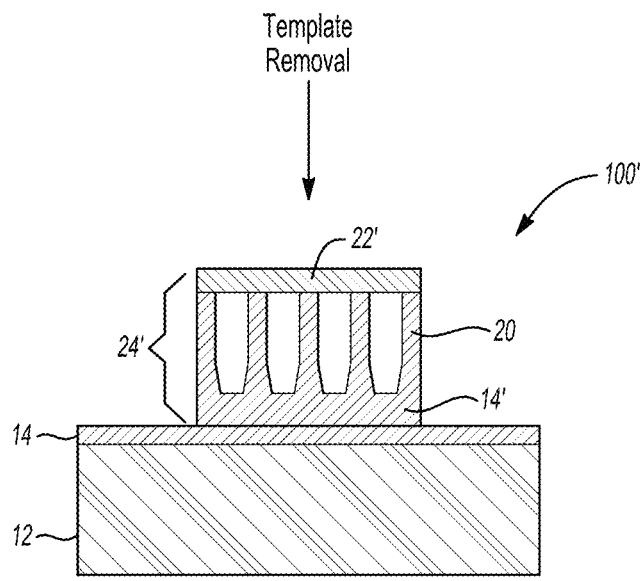
Figure 8:
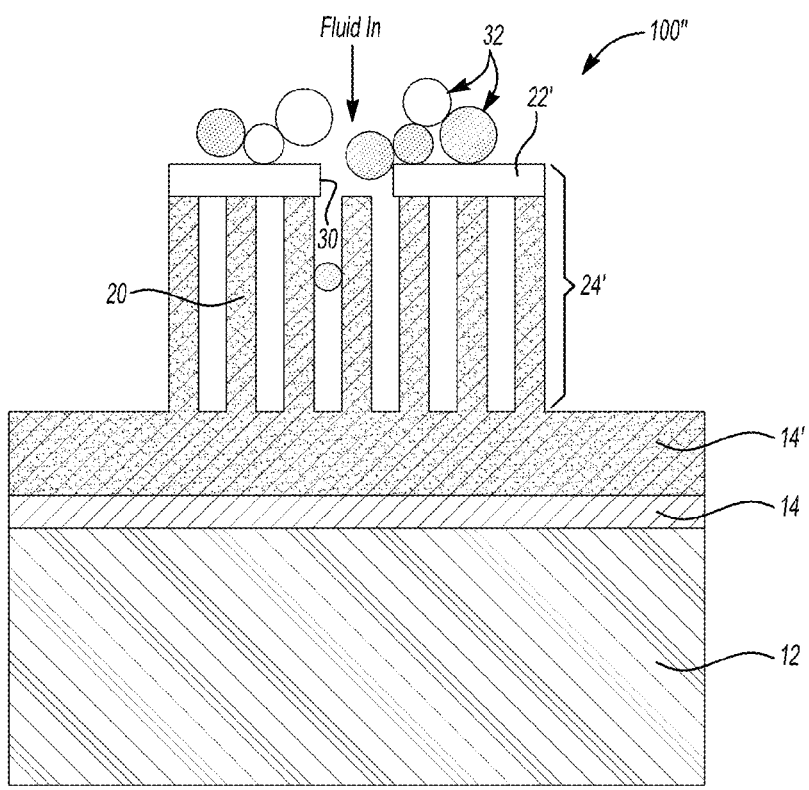
FIG. 8 schematically depicts another example of a micro-structure that may be used for micro- or nano-filtration.
Figure 10:
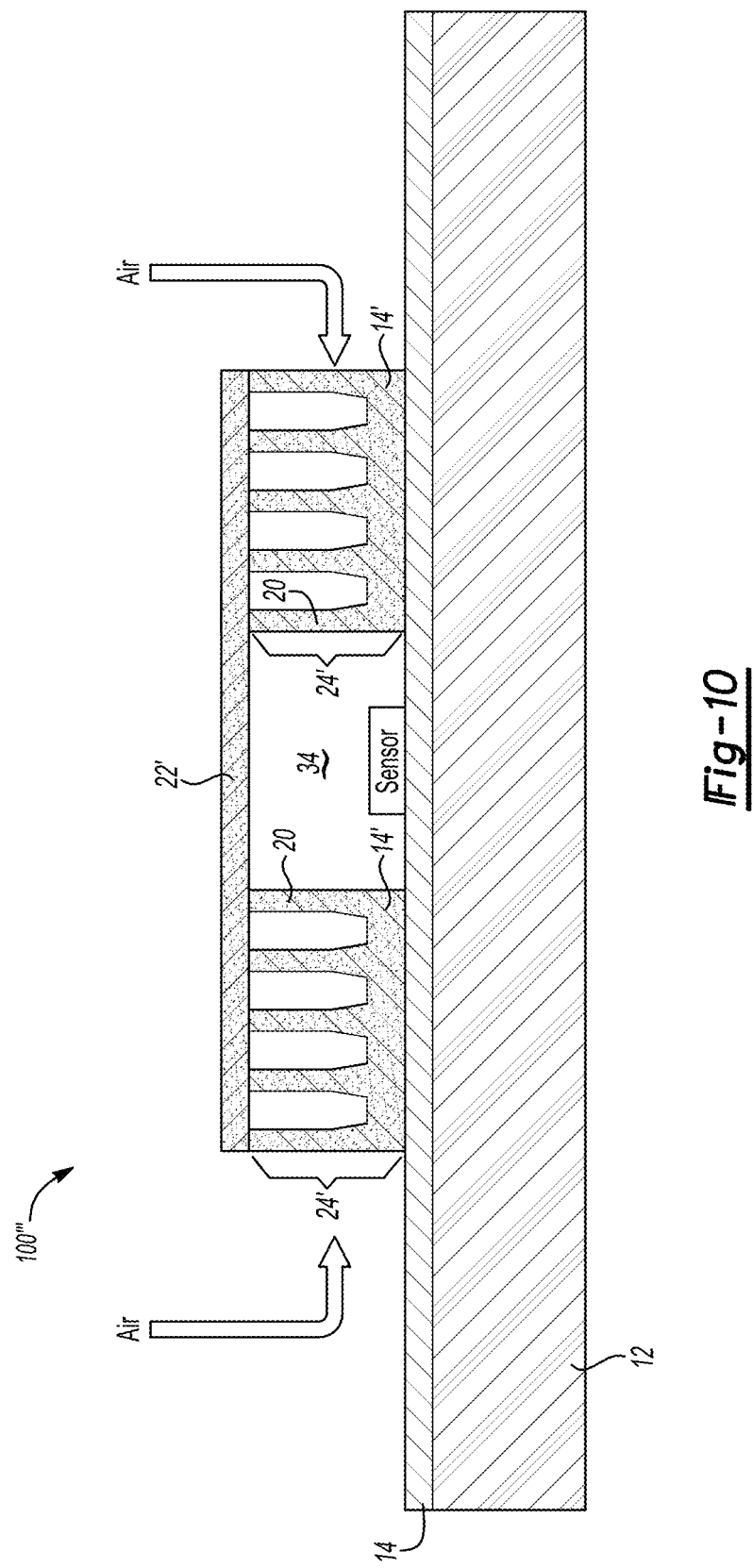
FIG. 10 is a schematic diagram of another embodiment of the micro-structure of FIG. 1K used as a filter for gas filtration and sensing.

One example of the micro-structure is identified by reference numeral 100 shown in FIG. 1I, another example of the micro-structure is identified by 100' shown in FIG. 1K, and still other examples of the micro-structure are identified by 100" and 100'" are shown, respectively, in FIGS. 8 and 10. It is to be understood that the embodiment(s) of the method may be used to selectively control the placement of each nano-pillar in the micro-structures 100, 100', 100", 100'" so that each nano-pillar is substantially uniformly spaced from an adjacent nano-pillar and/or each set of nano-pillars (e.g., for a micro-cluster) is substantially uniformly spaced from an adjacent set of nano-pillars. In other words, the size of a gap formed between adjacent nano-pillars or sets of nano-structures may be selectively controlled. In instances where the nano-structure is used as a micro- or nano-filter, the controlled size of the gap at least between adjacent nano-pillars advantageously improves the selectivity of the device. Furthermore, the nano-structures 100, 100', 100", 100''' enable micro- or nano-filtration of fluidic media in a vertical direction (see, e.g., FIG. 8) or in a lateral direction (see, e.g., FIG. 10). Vertical filtration enables the filtrate to reach a substrate surface relatively quickly. This may be desirable when the substrate surface is a sensing surface. Lateral filtration provides a path for effective separation. The embodiments of the structure 100, 100', 100", 100''' can improve both the selectivity and efficiency of the filtration process.

The embodiment(s) of the method may also be used to control other properties of the nano-pillars. The geometry and/or dimensions of the nano-pillars (such as their height, diameter, shape, etc.) may be controlled by adjusting one or more parameters of the anodizing process employed in the instant methods. The process(es) used for controlling the property/ies of the nano-pillars will be described in further detail below. In one example, the geometry of the nano-pillars may be controlled so that the nano-pillars each have a uniform aspect ratio (where the difference between nano-pillars does not exceed 10%). This imparts at least some flexibility to the micro-structures 100, 100', 100", 100''' so that the micro-structures 100, 100', 100", 100''' can be used as shock absorbers. The control allowed throughout the processes disclosed herein enables process uniformity and reproducibility at least up to the wafer level.

One embodiment of the method of forming the nano-structure 100 (depicted in FIG. 1I) is schematically depicted in FIGS. 1A through 1I, while another embodiment of the method of forming the micro-structure 100' (depicted in FIG. 1K) is schematically depicted in FIGS. 1A through 1G, 1J, and 1K. As mentioned above, still another embodiment of forming the micro-structure 100''' (depicted in FIG. 10) is described below in conjunction with FIG. 10. The micro-structures 100, 100', 100", 100''' formed by the embodiments of the instant method may, in some instances, be planar structures that, as mentioned above, may be used as shock absorbers, sensors, and/or the like. In some cases, as also mentioned above, the micro-structures 100, 100', 100", 100''' may also be used as micro- or nano-filters for liquid filtration/separation. The micro-structures 100, 100', 100", 100''' may also be used for gas filtration/separation, such as, for example, when portions of the nano-structures 100, 100', 100" are exposed to air, it may be desirable to filter out particles from the air that should not reach a sensor (see, e.g., FIG. 5 discussed further hereinbelow). It is to be understood, however, that the micro-structures 100, 100', 100", 100''' may also be used for other applications, such as for actuators, pumps, or for delivery of small and discrete quantities of liquid to a particular location, for example, via a capillary effect (where liquid is sucked into spaces between the pillars when the surface properties (e.g., surface tension, contact angle, etc.) of the pillars are aligned with the properties of the liquid).

Referring now to FIG. 1A, the method of forming the nano-structure 100 includes forming a multi-layered structure 10 that contains i) an oxidizable material layer 14 established on a substrate 12, and ii) another oxidizable material layer 16 established on the oxidizable material layer 14. The multi-layered structure 10 may be formed, for example, by depositing an oxidizable material on the substrate 12 to form the oxidizable material layer 14 having a thickness, and then depositing another oxidizable material on the oxidizable material layer 14 to form the other oxidizable material layer 16, which also has a thickness. In one embodiment, the oxidizable material layer 14 is formed of a metal or metal alloys that forms a dense oxide after electrochemical oxidation and the other oxidizable material layer 16 is formed of a metal or metal alloy that forms a porous oxide after electrochemical oxidation. Examples of suitable materials will be discussed further hereinbelow.

The layers 14, 16 have respective thicknesses that may be different or may be substantially the same. In one embodiment, the thickness of each of the layers 14, 16 ranges from about 10 nm to about 10 μm. The layer 14 may have any suitable thickness that will produce (during electrochemical oxidation) enough oxide to form the nano-pillars 20. In an example, the thickness of the oxide grown from the layer 14 (i.e., the structure 14', the nano-pillars 20, and the cap layer 22) is determined by multiplying the anodization voltage by an anodization coefficient (i.e., the number of nanometers that the oxide grows per one volt of anodization voltage). For instance, for a Ta layer 14, about 1.8 nm of $Ta_2O_5$ grows per volt of anodization voltage applied to the layer 14 to form a dense $Ta_2O_5$ film. In another instance, from about 1.3 nm to about 1.8 nm of $Ta_2O_5$ grows per volt of anodization voltage applied to the layer 14 to form nano-pillars with an underlying dense $Ta_2O_5$ film. In the latter instance (i.e., when there is a dense $Ta_2O_5$ film beneath the nano-pillars), the anodization coefficient depends, at least, on the diameter of the pores in the template 16', the overall porosity of the template 16', the nature of the electrolyte used for Ta anodization, and the current density during Ta anodization.

The thickness of the Ta layer 14 should be thick enough to produce a $Ta_2O_5$ layer having any desired thickness and, in some cases, to maintain some of the Ta layer 14 on the substrate 12 underneath the formed nano-pillars 20 and the dense portion of $Ta_2O_5$ (i.e., 14'). For example, to produce a dense $Ta_2O_5$ layer with no nano-pillars, the total thickness of the Ta layer 14 may be calculated by i) multiplying the completed anodization voltage (i.e., the specific voltage at which the oxide thickness reaches a steady state value) by 1.8 nm of $Ta_2O_5$ growth per volt to determine the thickness of $Ta_2O_5$ that grows, and ii) then dividing that number by the expansion coefficient (i.e., the ratio of $Ta_2O_5$ to consumed Ta), which is 2.3. For instance, if an anodization voltage of 200 V is used and 1.8 nm of $Ta_2O_5$ grows per volt (which produces about 360 nm of $Ta_2O_5$), and the expansion coefficient is 2.3, then the thickness of the Ta layer 14 is about 160 nm. In instances where nano-pillars, with an underlying dense $Ta_2O_5$ film, are grown from the Ta layer 14, the thickness of the Ta layer 14 is based, at least in part, on the volume of $Ta_2O_5$ (which depends, at least in part, on the fraction of pillars in the entire stack, as well as their filling factor, i.e., pillar density) and the anodization coefficient (which depends, at least in part, on the electrolyte used and the anodization conditions, and is from about 1.3 nm to about 1.8 nm per volt for tantalum). The following is an example of how the Ta layer thickness is calculated when it is desirable to form both nano-pillars and the underlying dense layer. In this example, the nano-pillars with an underlying dense $Ta_2O_5$ layer are fabricated at 200 V. The height of pillars is 240 nm and the dense layer is 50 nm. The anodization coefficient is 1.45 nm/V. The pillar filling factor (or pillars density) is around 25%. In this example, nano-pillars of 240 nm are equivalent to 60 nm of dense $Ta_2O_5$, and thus there is a total of 110 nm of dense $Ta_2O_5$ that will be formed. In order to generate 110 nm of dense $Ta_2O_5$, at least about 50 nm of Ta is used in layer 14 (i.e., 110/2.3≈47.8). In other examples, these calculations may be performed assuming that the overall density of the nano-pillars is about 90%.

The thickness of the layer 16, on the other hand, should be thick enough to form a template 16' (see FIG. 1B) that has a height that greater than the height of the nano-pillars 20 to be grown from the layer 14. In one example, the layer 16 has a thickness of 100 nm or less. In another example, the layer 16 has a thickness of 50 nm or less. In still another example, the thickness of the template 16' is about the thickness of the layer 16 times the expansion coefficient (e.g., about 1.3, which is the ratio between the thickness of the porous anodic alumina and the thickness of the aluminum layer 16 consumed).

In an example, each of the layers 12, 14 are planar (e.g., are substantially flat and may include, if any, a minimal amount of irregularities). In another example, one or more of the layers 14, 16 are non-planar. In this example, the non-planar layer(s) 14, 16 may also include a special morphology, features, structures, and/or the like that are etched into or incorporated into the layers 14, 16. The planar or non-planar layers 14, 16 may be deposited on a planar or non-planar substrate 12, which will be described further below.

The deposition of the oxidizable material on the substrate 12 and the deposition of the other oxidizable material on the oxidizable material layer 14 may be accomplished using any suitable deposition technique known in the art. Some examples of suitable deposition techniques include physical vapor deposition (PVD) (such as, e.g., sputtering, thermal evaporation, and/or pulsed laser deposition), atomic layer deposition (ALD), or, in some instances, chemical vapor deposition (CVD).

The substrate 12 upon which the oxidizable material is deposited to form the layer 14 may be chosen based, at least in part, on the application for which the micro-structure 100 will ultimately be used. If, for example, the micro-structure 100 is to be used for semiconductor applications, the substrate 12 may be chosen from suitable support structures for semiconductors such as, e.g., a substantially planar silicon wafer. By "substantially planar", it is meant that the surface is flat but may contain some irregularities. In this example, the substrate 12 may have formed thereon a layer of insulating material (not shown) such as, e.g., silicon oxide or silicon nitride. The substrate 12 may also or otherwise be a non-planar structure, e.g., the substrate 12 may have a special morphology etched on or fabricated into the substrate 12. The substrate 12 may also be chosen from other materials such as, e.g., glass, quartz, alumina, stainless steel, plastic, and/or the like, and/or combinations thereof. In instances where the micro-structure 100 is used as a filter, the substrate 12 may be chosen from a silicon wafer having a thermally grown oxide (TOX) layer thereon, such as TOX/Si or $SiO_2$/Si. In an example, TOX/Si may be formed by oxidizing Si at a high temperature (i.e., from about 800° C. to about 1200° C.) using water vapor (steam) or molecular oxygen as the oxidant. In other words, TOX/Si may be formed via dry or wet oxidation, and the TOX/Si oxide layer may be referred to as a high temperature oxide layer. In some cases, a dry oxygen atmosphere produces a higher quality $SiO_2$, but the process itself is relatively slow. For thicker TOX/Si layers (i.e., a thickness of about 0.5 µm to about 4 µm or more), oxidation of the Si in a wet oxygen atmosphere is desirable. Other examples of TOX include, but are not limited to, SiN, SiC, TEOS (which is $SiO_2$, but is prepared using a chemical vapor deposition (CVD) method from tetra-ethyloxy-silane (i.e., tetra-ethyl-ortho-silicate)), or the like.

The oxidizable material for the oxidizable material layer 14 is a conductor and may be chosen from a material that i) can be electrochemically oxidized and ii) has an expansion coefficient, during oxidation, that is more than 1. In some cases, the oxidizable material for the layer 14 may also or otherwise be thermally oxidized. In one embodiment, the oxidizable material layer 14 includes a material having an expansion coefficient that is more than 1. Without being bound to any theory, it is believed that an expansion coefficient of more than 1 allows the oxidizable material to squeeze into the pores 18 of the template 16' (which will be described in further detail below). It is further believed that the height of the nano-pillars 20 that are formed may, at least partially, be based on the expansion coefficient of the material in the layer 14. In an example, a nano-pillar 20 height ranging from about 10 nm to 1000 nm may be achieved when the expansion coefficient of the oxidizable material in layer 14 is more than 1. It is to be understood that the height of the nano-pillars 20 (including the thickness of structure 14') may also be based, at least in part, on other factors including the anodization voltages used during the respective anodization of layers 16 and 14. Further details about the height of the nano-pillars 20 will be described below. Some examples of suitable oxidizable materials include tantalum (which has an expansion coefficient for thermal oxidation of 2.3, as mentioned above), titanium (which has an expansion coefficient for thermal oxidation of 1.7), niobium (which has an expansion coefficient for thermal oxidation of 2.7), and tungsten (which has an expansion coefficient for thermal oxidation of 3.3). It is to be understood that the expansion coefficient for thermal oxidation for each of the foregoing materials is substantially the same as that for electrochemical oxidation so long as the phase of each of these materials during oxidation is the same.

The other oxidizable material for the other oxidizable material layer 16 is also a conductor, but is chosen from a metal or metal alloy that, after electrochemical oxidation, produces a porous oxide. One example of the other oxidizable material includes aluminum or aluminum alloys, such as an aluminum alloy having aluminum as the main component. It is further to be understood that silicon, titanium, tantalum, niobium, and tungsten in the aluminum alloy may be present in small quantities such as, e.g., up to about 5%. Another example of the other oxidizable material includes titanium, where such material may be oxidized using an appropriate electrolyte and anodization conditions to ultimately produce a porous oxide. In still another embodiment, the material layer 16 may be formed of silicon. When silicon is selected, field assisted anisotropic etching of silicon may take place in the presence of an HF-based electrolyte to create a porous silicon template, which is then oxidized to form a porous silicon dioxide template. It is believed that the layer 14 can still be anodized in the desirable manner when porous silicon dioxide is used as the template 16'. In yet another example, it is believed that the silicon may be transformed into $Si_xN_y$, which is not an oxide but is a dielectric and may be used as a template for $Ta_2O_5$ nano-pillar growth.

The oxidizable material forming the oxidizable material layer 14 and the other oxidizable material forming the other oxidizable material layer 16 are substantially pure. As used herein, the term "substantially pure" refers to a material (such as a metal or a metal alloy) having a minimal amount, if any, impurities present therein. In an example, a substantially pure metal may be one that includes at least 95% of the metal. In some cases the substantially pure metal includes about 100% metal, and thus practically no impurities. In these cases, the metal may be referred to as a substantially pure metal, a pure metal, or just a metal. In an example, the substantially pure metal has at least about a 99.9% (e.g., often expressed as 3N), and in some cases at least about 99.99% purity (e.g., often expressed as 4N). It is to be understood that, in some instances, the oxidizable material and/or the other oxidizable material may be a metal alloy.

For purposes of illustration, the methods depicted in the FIG. 1 series will now be described using tantalum as the oxidizable material in the oxidizable material layer 14, and aluminum as the oxidizable material in the other oxidizable material layer 16. As such, in reference to FIGS. 1A through 1K, the layer 14 will be referred to as the tantalum layer 14, and the layer 16 will be referred to as the aluminum layer 16. However, as previously noted, the layers 14 and 16 are not to be construed as being limited to being formed of tantalum and aluminum, respectively, but can be any of the oxidizable materials listed herein for the respective layers 14, 16.

After the multi-layered structure 10 is formed, a template 16' is formed out of the aluminum layer 16, as shown in FIG. 1B. In one embodiment, the template 16' is formed by anodizing the aluminum layer 16. Anodization refers to the oxidation of less than the entire thickness of the layer being anodized. It is to be understood that enough of the aluminum layer 16 is anodized to form the desired template 16', which includes a plurality of pores 18 defined therein and a barrier layer B of alumina that defines the bottom of each pore 18. As illustrated in FIG. 1B, after template 16' formation, there is some remaining non-anodized aluminum 16 (e.g., the pyramids of aluminum 16).

Referring back to FIG. 1B, anodization of the aluminum layer 16 to form the template 16' may be accomplished by employing the aluminum layer 16 as the anode of an electrolytic cell and selecting at least one of $H_2SO_4$ (sulfuric acid), $H_3PO_4$ (phosphoric acid), $C_2H_2O_4$ (oxalic acid), or $H_2CrO_4$ (chromic acid) as the electrolyte. These electrolytes form porous alumina rather than dense alumina. The electrolyte may be present in a water based solution. In one embodiment where the electrolyte is oxalic acid ($C_2H_2O_4$), the electrolyte may be present, in solution with water, at a wt % ranging from about 1 wt % to about 5 wt %. In another embodiment where the electrolyte is $H_2SO_4$, the electrolyte may be present, in solution with water, at a vol % ranging from about 5 vol % to about 40 vol %. In some instances, certain additives (e.g., an alcohol, a surfactant, etc.) may also be added to the electrolyte solution. It is to be understood that the concentration of electrolyte in solution and the other conditions may vary as long as they are suitable for porous anodization (i.e., the formation of the porous template 16'). Any suitable cathode may be used, for example, aluminum or platinum (e.g., foil or mesh). A suitable amount of voltage and current is then applied to the electrolytic cell for an amount of time to anodize the aluminum layer 16 (i.e., where the anodized portion of the aluminum layer 16 is oxidized). The anodization of the aluminum layer 16 forms porous anodic aluminum oxide (i.e., porous anodic alumina), and allows the alumina to grow to a desired thickness.

The porous template 16' is shown in FIG. 1B. It is to be understood that the pores 18 at this point in the process do not extend through to, and expose, the underlying tantalum layer 14. The size of the pores 18 formed during anodization may be controlled through the selection of the electrolyte and the anodization conditions. For instance, for an alumina template, the diameter D of a cell 17 is about 2.8 nm per volt (e.g., when Al is used for layer 16), and the diameter d of the pore 18 depends on the electrolyte and the current density. In one embodiment, the diameter d of the pore 18 is proportional to the voltage used. The ratio of the cell diameter and the pore diameter (D/d) is, for example, 3.3 for a $H_2CrO_4$ electrolyte, 4.9 for a $H_2SO_4$ electrolyte, 3.0 for a $H_2C_2O_4$ electrolyte, and between 1.7 and 2.1 for a $H_3PO_4$ electrolyte. As some examples, pores of the following sizes may be obtained using the following electrolytes: pores having about 20 nm diameters may be obtained using $H_2SO_4$ as the electrolyte, pores having about 40 nm diameters may be obtained using $C_2H_2O_4$ as the electrolyte, and pores having about 120 nm may be obtained using $H_3PO_4$ as the electrolyte. The size of the pores 18 may also be controlled via anisotropic etching after anodization is complete. This etching process further defines the already formed pores 18, and in many instances increases the diameter of the formed pores 18. Anisotropic etching may be performed using diluted phosphoric acid (5 vol. %), a solution of $H_2SO_4$ (20 vol. %), or a diluted form of a hydroxide such as, e.g., NaOH or KOH. The time for etching may vary, depending, at least in part, upon the desirable average diameter for the final pores 18. In an embodiment, the anisotropic etching time ranges from about 1 minute to about 45 minutes in instances where anisotropic etching is performed using a diluted phosphoric acid (5 vol. %). The temperature for etching may also depend upon the process and etchant used. In one embodiment, the etchant temperature ranges from about 0° C. to about 100° C. depending, at least in part, on the type of etchant used. In an example, the etchant temperature ranges from about 20° C. to about 40° C., for example, when a diluted phosphoric acid etchant is used.

In another embodiment, prior to performing anodization, the method includes patterning the aluminum layer 16. Patterning may be accomplished via any suitable technique, and is used to perform localized anodization of the aluminum layer 16. Any standard photolithography method may be utilized. One example of patterning with standard photolithography includes depositing a hard mask material (e.g., $Si_xN_y$, such as SiN or $Si_3N_4$) on the aluminum layer 16, and then using a photoresist to pattern the $Si_xN_y$ material to allow localized exposure of aluminum. In an example, the mask is patterned to expose portion(s) of the aluminum to the electrolyte. In some cases, the aluminum may also be patterned and etched to produce clusters of aluminum (i.e., formed when areas of aluminum are etched, but the Ta is still present). In other cases, aluminum and tantalum are patterned and etched to produce clusters of aluminum/tantalum. In this example, the interface formed between the mask and the aluminum layer 16 is robust, which advantageously prevents separation of the layers during anodization. In one embodiment, the areas that remain exposed once the mask and photoresist are in position are subject to local anodization. The aluminum layer exposed via the patterned mask or the patterned aluminum layer (not shown) is then locally anodized, for example, by employing the exposed or patterned aluminum layer as the anode of an electrolytic cell, and employing any suitable cathode, such as aluminum (having a 99.99% purity) and/or platinum (foil or mesh). The electrolyte may be selected from any electrolyte that will suitably allow the formation of porous alumina. Some examples of the electrolyte include solutions of $H_2SO_4$, $H_3PO_4$, $H_2C_2O_4$, and $H_2CrO_4$. A suitable voltage and current is then applied to the electrolytic cell for an amount of time to completely or fully anodize the patterned aluminum layer (i.e., where the entire thickness of the patterned aluminum layer is oxidized).

Figure 3:
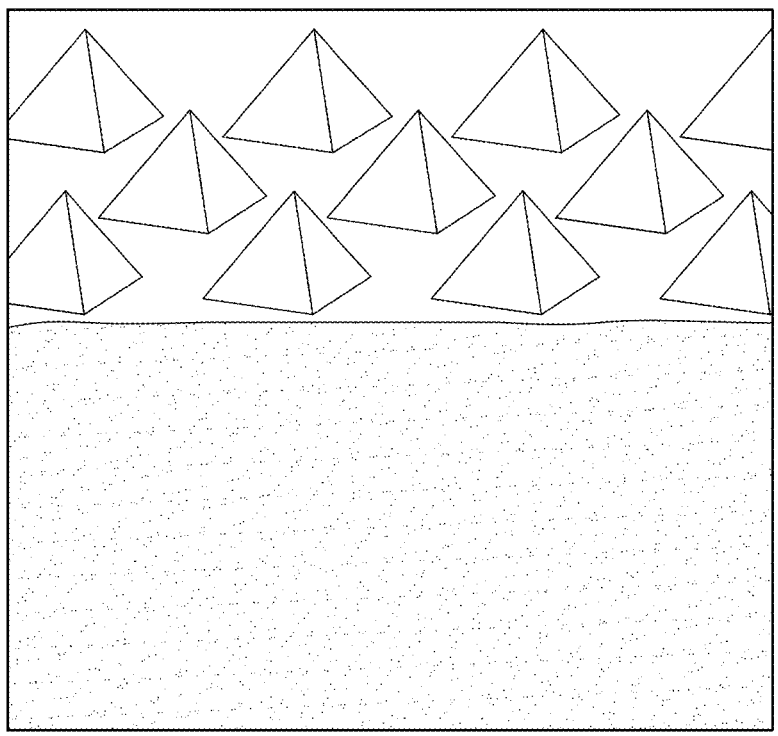
FIG. 3 is a schematic side view of an example of a master that can be used to form an embodiment of an anodic alumina template.
Figure 4A:
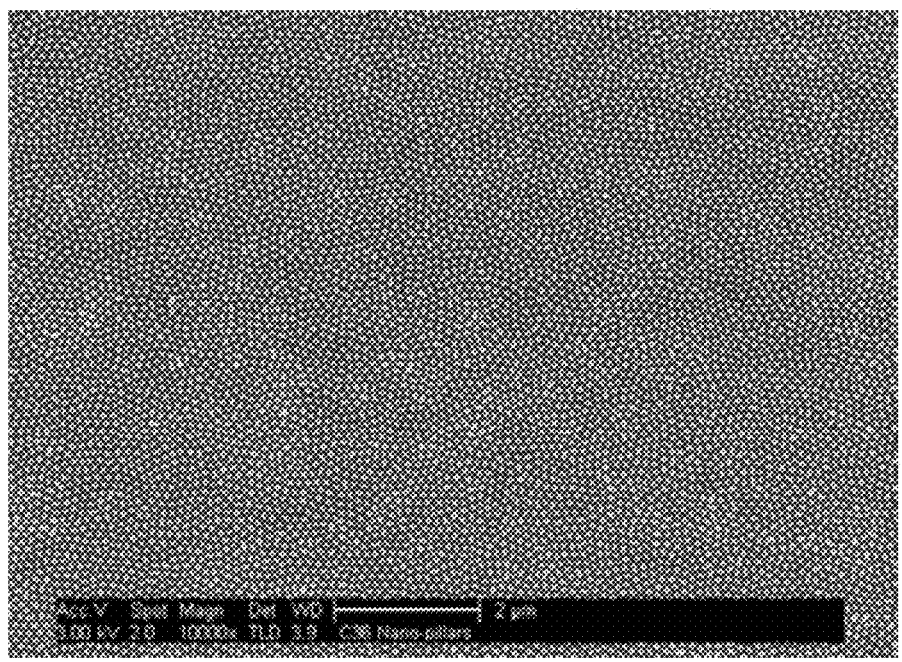
FIGS. 4A through 4D are scanning electron micrograph (SEM) images of a top view (FIG. 4A), a cross-section (FIG. 4B), another top view at a higher magnification than that shown in FIG. 4A (FIG. 4C), and a tilted view (FIG. 4D) of a micro-structure including nano-pillars having a diameter of about 65 nm and a gap between adjacent nano-pillars of about 105 nm.
Figure 4B:
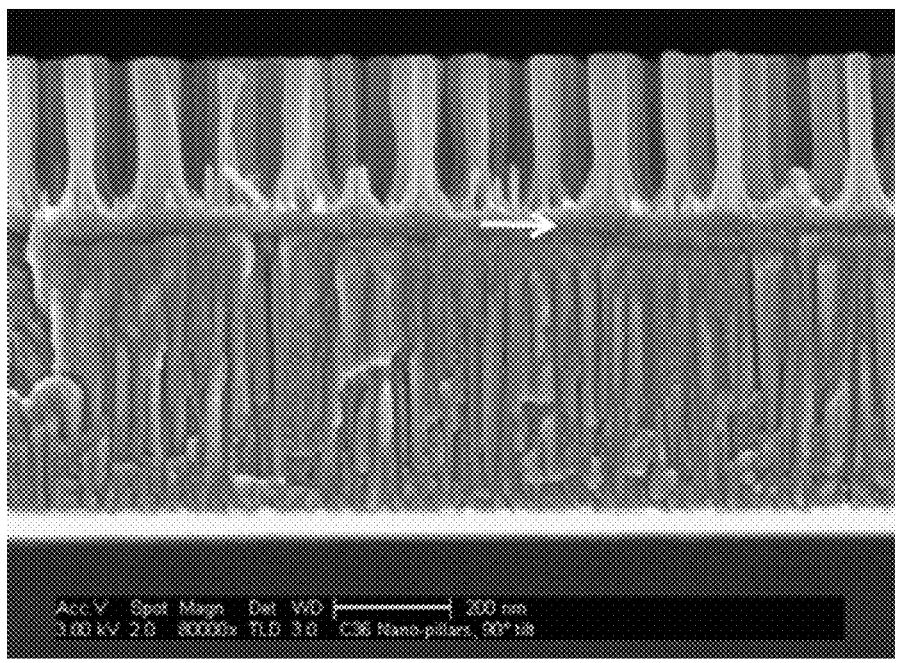
Figure 4C:
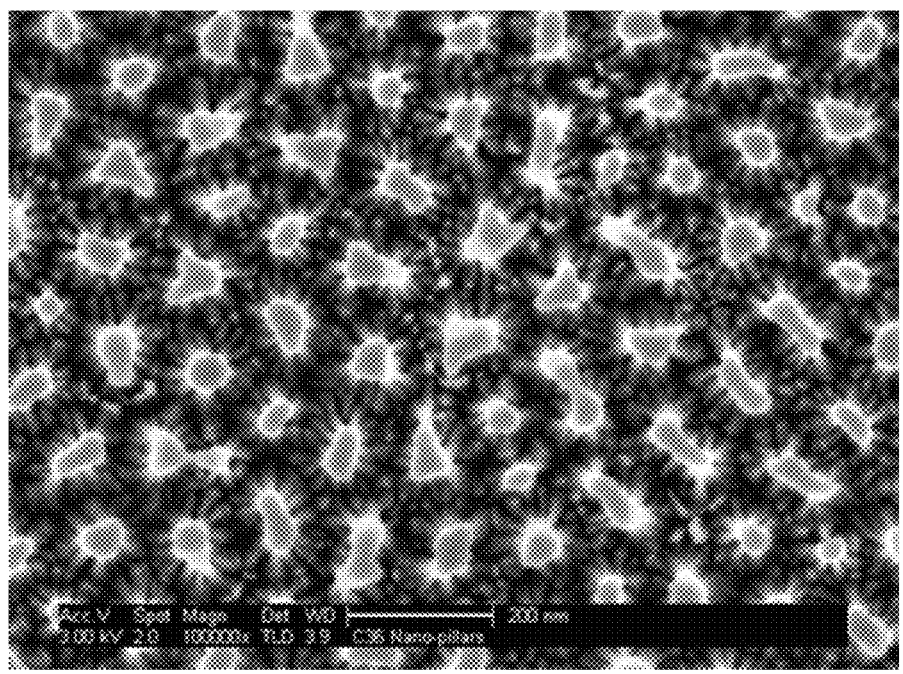
Figure 4D:
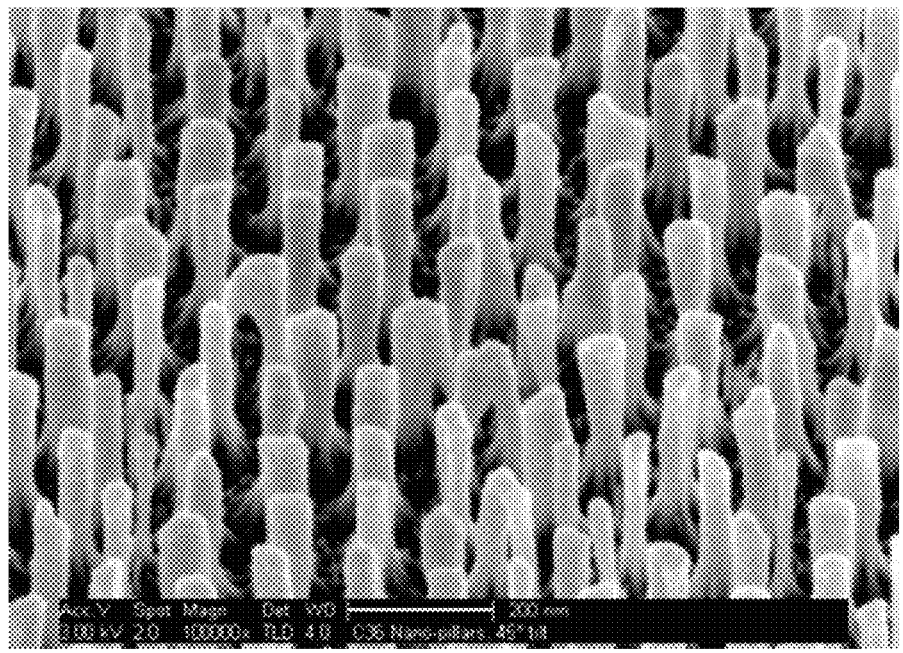
Figure 5A:
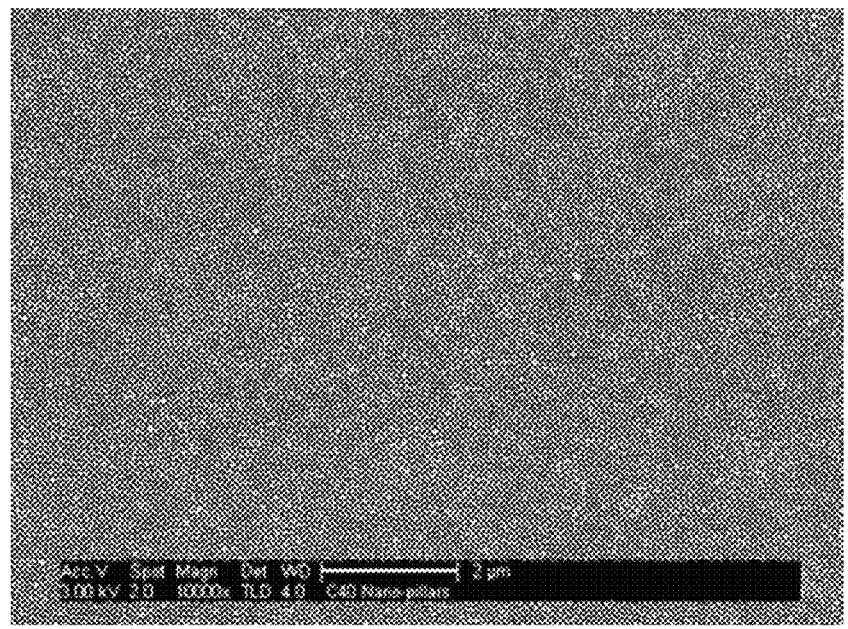
FIGS. 5A through 5D are SEM images of a top view (FIG. 5A), a cross-section (FIG. 5B), another top view at a higher magnification than that shown in FIG. 5A (FIG. 5C), and a tilted view (FIG. 5D) of a micro-structure including nano-pillars having a diameter of about 30 nm and a gap between adjacent nano-pillars of about 50 nm.
Figure 5B:
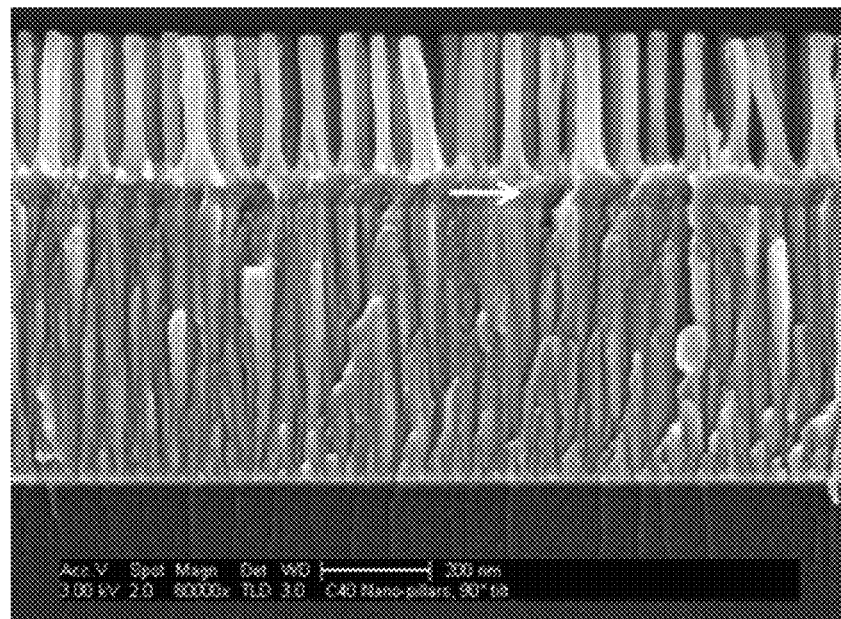
Figure 5C:
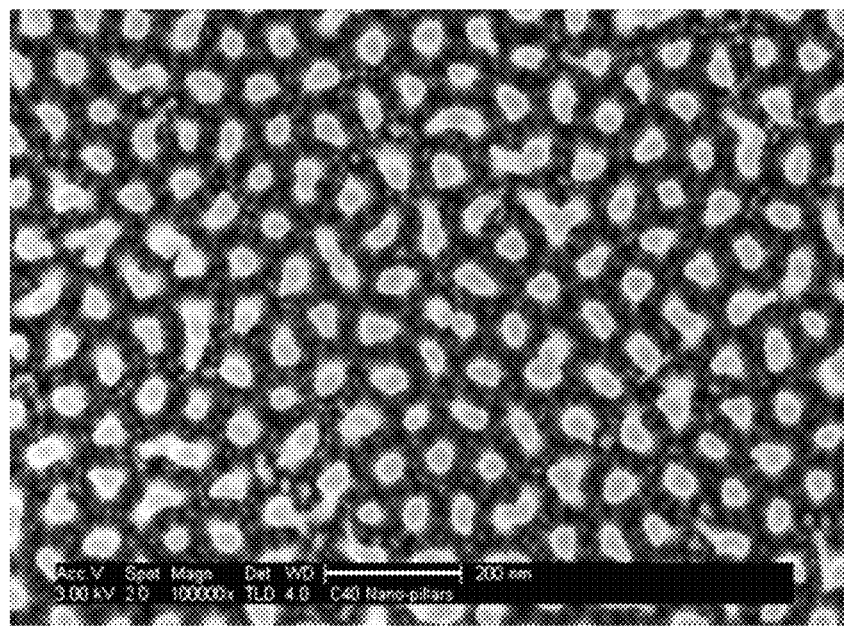
Figure 5D:
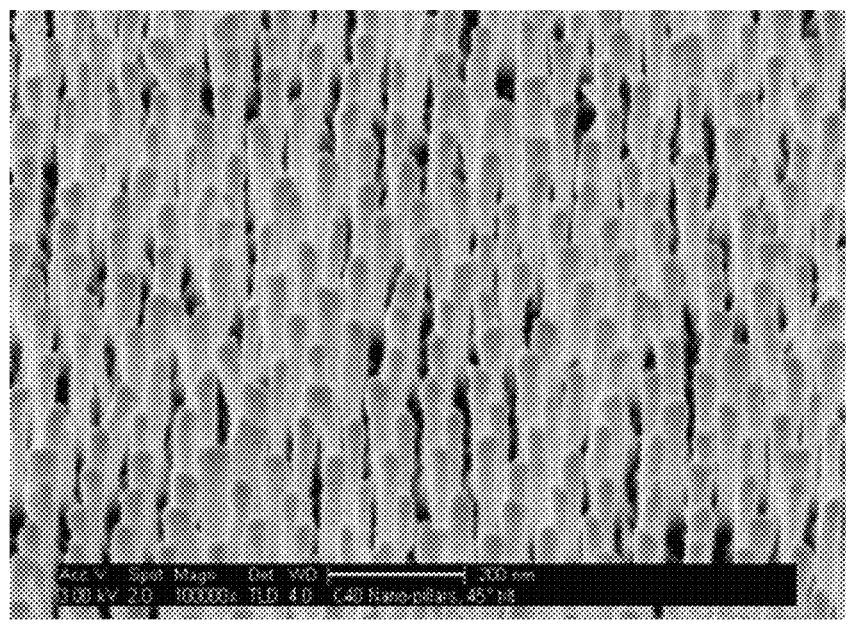
Figure 6A:
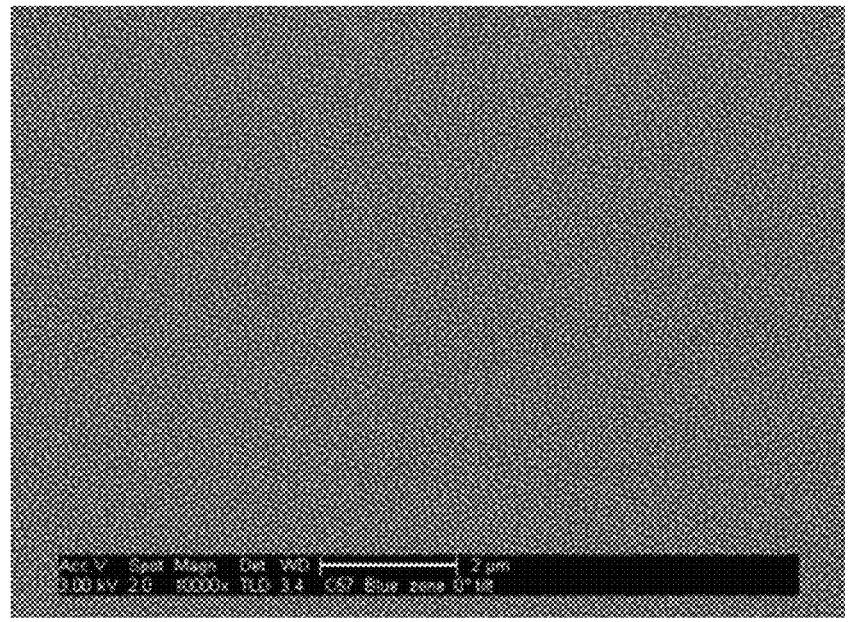
FIGS. 6A through 6D are SEM images of a top view (FIG. 6A), a cross-section (FIG. 6B), another top view at a higher magnification than that shown in FIG. 6A (FIG. 6C), and a tilted view (FIG. 6D) of a micro-structure including nano-pillars having a diameter of about 15 nm and a gap between adjacent nano-pillars of about 25 nm.
Figure 6B:
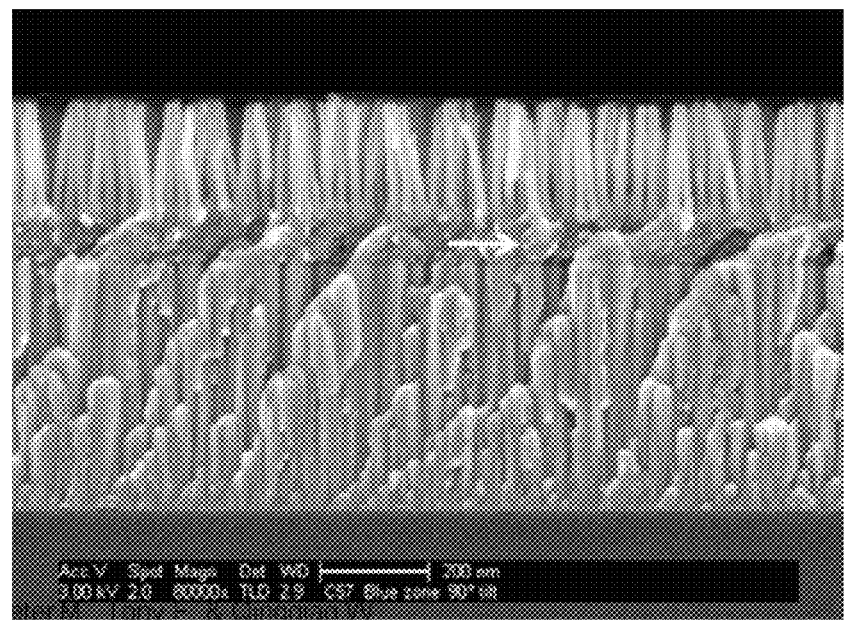
Figure 6C:
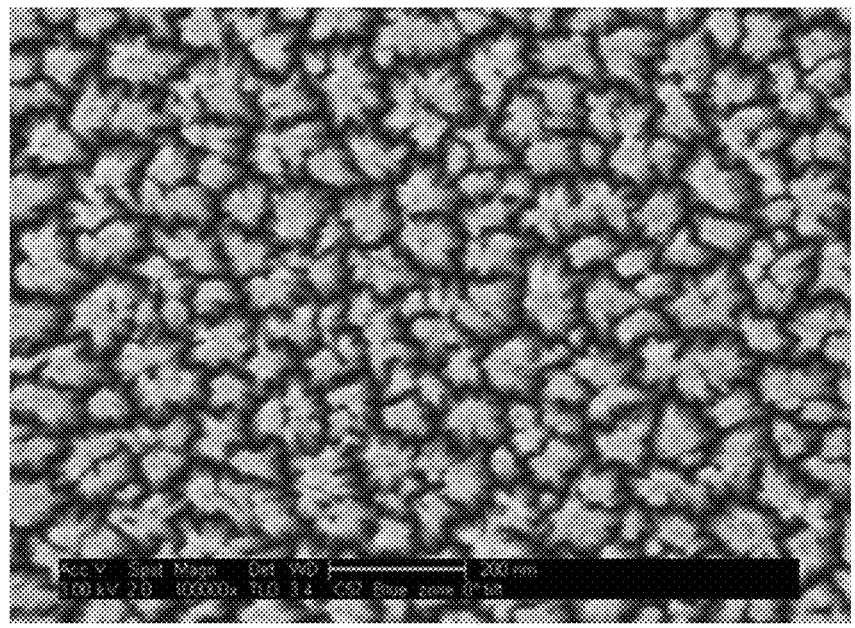
Figure 6D:
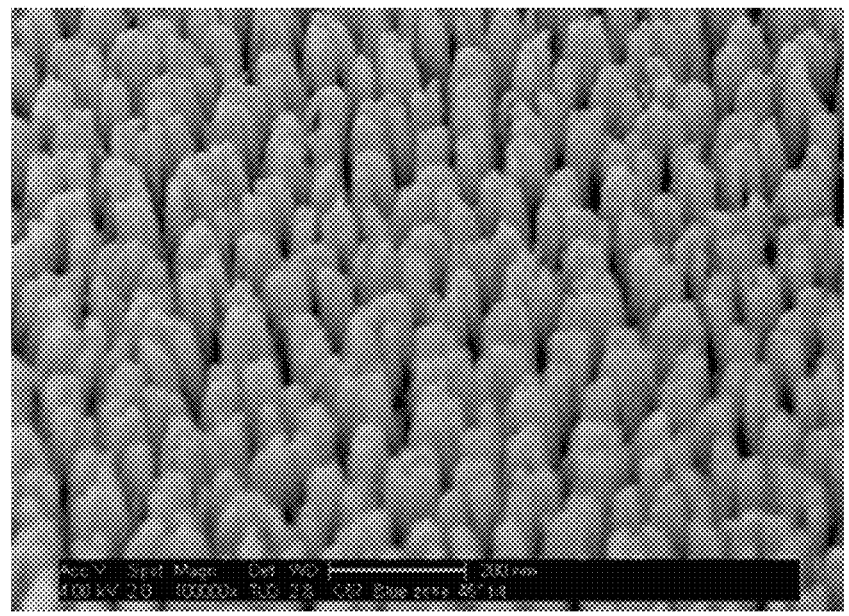

In still another embodiment, the template 16' may be patterned by transferring a pattern from a master (see, e.g., reference numeral 28 in FIG. 3) onto the aluminum layer 16 (which may be annealed prior to the transfer). In one example, a SiC master having a surface with hexagonally-ordered array of convexes may be pressed against the aluminum layer 16 to form an array of concaves on the surface of the aluminum layer 16. The aluminum layer 16 may thereafter be anodized via the method described above using a constant voltage (i.e., a potentiostatic regime). The dimensions of the master 28 are chosen for a specific anodic alumina cell diameter D, and as such, that master 28 is used to obtain a single cell diameter D and a single pore diameter d (noting that small differences may be expected for pore diameter d when different electrolytes and/or anodization voltages are used). This method forms a highly hexagonally-ordered array of pores (having uniform diameters) in the anodic alumina.

The combination of patterning and anodization forms a porous anodic alumina template 16' with specific dimensions (e.g., a hexagonally-ordered array of pores). The template 16' formed via this embodiment of the method may also be anisotropically etched as previously described to further define the pores 18.

In one example, the anodization of the aluminum layer 16 may be accomplished via a potentiostatic regime, whereby a constant anodization voltage is applied. Due at least in part to the pore diameter being proportional to voltage, anodization using a constant voltage produces pores having a substantially constant diameter from top to bottom. In another example, the anodization may be accomplished via a galvanostatic regime, whereby a constant current density is applied, and thus a constant rate of anodization is achieved. In this example, the voltage may vary during the anodization, which produces pores having a varying diameter from top to bottom.

Figure 2A:
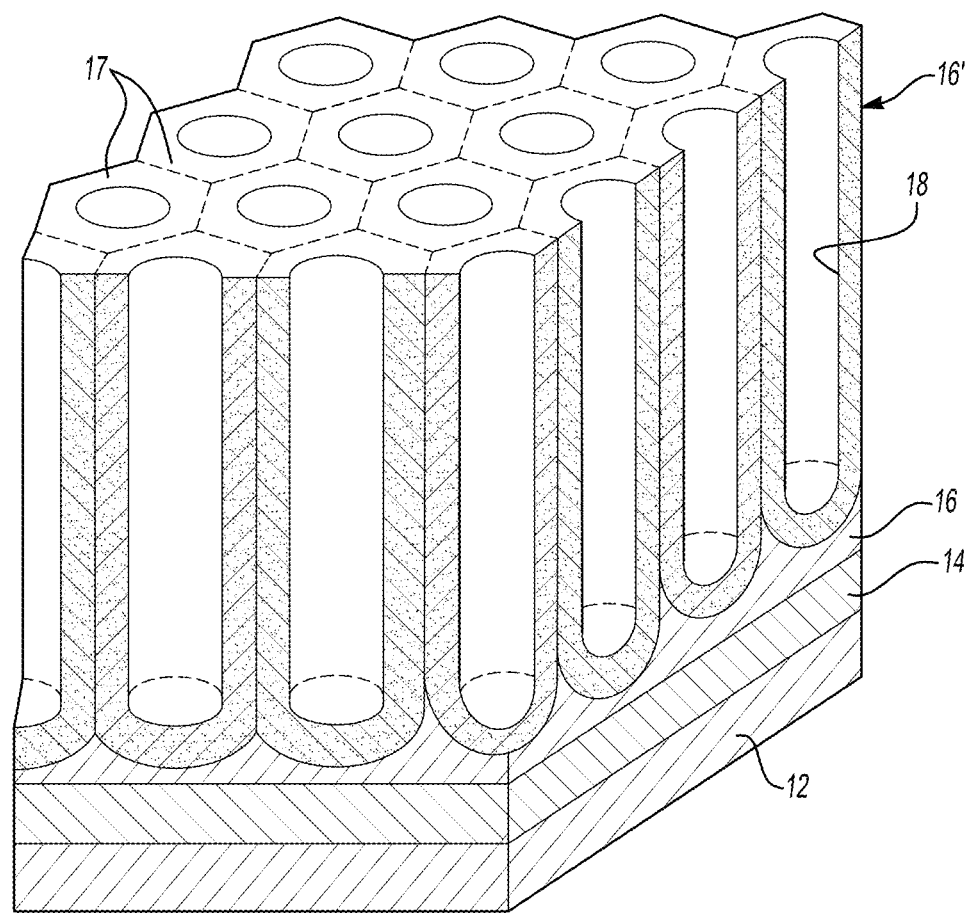
FIG. 2A is a schematic three-dimensional representation of the porous anodic alumina template prior to complete anodization of the aluminum.

The anodic alumina template 16' is schematically shown in FIG. 1B (cross-sectional view). Another example of the anodic alumina template 16' (where a portion of the aluminum layer 16 remains) is shown in FIGS. 2A (perspective view), 2B (top view), and 2C (an SEM image of a cross section of the template 16') where the template 16' includes a plurality of cells 17 (see FIGS. 2A and 2B) each having a pore 18 defined therein. It is to be understood that the SEM image shown in FIG. 2C was anisotropically etched for 30 minutes to increase the diameter of the pores 18. In an example, each of the pores 18 defined in the template 16' is oriented substantially normal to the substrate 12 surface.

Referring now to FIG. 1C, either anodization is continued or another anodization current and voltage is applied to initiate a plurality of steps that lead to complete anodization of the remaining aluminum layer 16 and the formation of tantalum pentoxide nano-pillars 20 (see FIGS. 1D and 1E). The anodization process that oxidizes remaining aluminum 16 and oxidizes the tantalum 14 may be accomplished, for example, using the same process described above for initial anodization of the aluminum layer 16 (to form the template 16'). In one embodiment, the anodization of remaining portions of the aluminum layer 16 and the layer 14 is accomplished by employing the tantalum layer 14 as the anode of an electrolytic cell and employing platinum, stainless steel, or any other appropriate material as the cathode, and applying a suitable anodization voltage and/or current density to initiate the various processes described herein.

It is to be understood that the remaining aluminum layer 16 (e.g., aluminum fragments located between alumina cells 17 of the template 16') may become anodized via a variety of methods. When the remaining aluminum layer 16 is anodized, it become alumina and essentially becomes part of the barrier layer B. This alumina barrier layer B is a dielectric layer between the electrolyte and the metal (in this case, tantalum).

It is to be understood that the remaining aluminum layer 16 can be anodized using the same electrolyte used to form the template 16', or can be anodized using another electrolyte that results in the formation of dense (as opposed to porous) alumina. When the electrolyte used to form the template 16' is used to oxidize the remaining aluminum layer 16, the anodization process used for the aluminum layer 16 may simply be continued until complete aluminum anodization is achieved and the tantalum interface is reached (as indicated, for e.g., by the change in current density). In the embodiment where the electrolyte used to complete aluminum anodization is the same electrolyte that forms the porous template 16', it is believed that the barrier layer B making up the bottom of the pores 18 is etched away by field assisted dissolving. This dissolution opens up the pores 18 to enable growth of tantalum pentoxide nano-pillars 20 therein. In this embodiment, tantalum anodization may be performed using the same electrolyte (i.e., the electrolyte that forms the porous template) or another electrolyte.

When the same electrolyte is used for template 16' formation and tantalum layer 14 anodization, the anodization process is continued in order to begin the oxidation of the tantalum layer 14. As shown in FIGS. 1B and 1C, in this embodiment, complete aluminum anodization (i.e., formation of the template 16', oxidation of the remaining aluminum 16, and dissolution of the bottom of each pore 18) and tantalum anodization may take place in the same electrolyte (e.g., oxalic acid). This electrolyte will form the template 16', anodize remaining aluminum 16, will dissolve alumina from the bottom of the pores 18, and will subsequently grow a dense oxide from the layer 14. This advantageously enables the barrier layer B at the bottom of each pore 18 to dissolve and the $Ta_2O_5$ to be generated at the same time, thus keeping the overall thickness of the oxide such that it corresponds to the applied voltage.

In another embodiment, complete aluminum anodization is performed in the electrolyte that results in the porous alumina template 16' with open pores 18 (e.g., oxalic acid), and then the electrolyte may be switched to form the dense tantalum pentoxide. In this embodiment, the electrolyte used during the subsequent anodization is selected from citric acid ($C_6H_8O_7$), boric acid ($H_3BO_3$), ammonium pentaborate (($NH_4)_2B_{10}O_{16} \times 8H_2O$), ammonium tartrate ($H_4NO_2CCH(OH)CH(OH)CO_2NH_4$), mixtures thereof, or another suitable electrolyte. This electrolyte will form the dense tantalum pentoxide layer 14' that will ultimately grow to form the nano-pillars 20.

In still another embodiment (not shown in figures), after the template 16' is formed and some aluminum layer 16 remains, another electrolyte (i.e., an electrolyte that results in the formation of a dense, rather than porous, alumina) is used to oxidize the remaining aluminum layer 16 and to grow the $Ta_2O_5$. In this embodiment, the electrolyte solution will be switched, and anodization of the remaining aluminum layer 16 and of the tantalum layer 14 will take place in this other electrolyte (examples of which include citric acid ($C_6H_8O_7$), boric acid ($H_3BO_3$), ammonium pentaborate (($NH_4)_2B_{10}O_{16} \times 8H_2O$), ammonium tartrate ($H_4NO_2CCH(OH)CH(OH)CO_2NH_4$), and/or another suitable electrolyte). In this embodiment, the anodization of the remaining aluminum layer 16 will form a dense alumina that increases the thickness of the barrier layer B, but will not open up the pores 18. Without being bound to any theory, it is believed that when the electrolyte selected to anodize the remaining aluminum layer 16 forms dense alumina (e.g., electrolyte is citric acid), the growth of the tantalum pentoxide nano-pillars will push the remaining barrier layer B up through the pores 18, which may be the source of alumina traces in the resulting nano-pillars 20.

Whichever process and electrolyte is selected for tantalum layer 14 anodization, it is to be understood that as the anodization of the oxidizable material layer 14 (in this example the tantalum layer 14) continues, the oxidized form of the tantalum (i.e., tantalum pentoxide structure 14') grows through the individual pores 18 defined in the template 16' to form a nano-pillar 20 of tantalum pentoxide in each pore 18, as shown in FIGS. 1D and 1E. This structure 14' is grown from the tantalum layer 14, and some of the structure 14' grows through the pores 18 of the template 16'. The growing of the structure 14' may be accomplished, for example, by partially anodizing the tantalum layer 14 (i.e., part of the layer 14 is oxidized, and part of the layer 14 remains non-oxidized) as previously described. As anodization continues, both the interface between the oxidizable material layer 14 and the formed anodic oxide (i.e., oxide structure) 14' and the interface between the anodic oxide 14' and the electrolyte (not shown) are planarized (see FIG. 1E).

The oxidized form of the tantalum formed during the anodization of the tantalum layer 14 is a substantially pure oxide. As used herein, a "substantially pure oxide" refers to an oxide that may include some impurities. Typically, dense oxides (such as the structure 14') have a smaller amount of impurities as compared to porous oxides (such as the template 16'). In one embodiment, the dense oxide includes a small portion of the alumina (or other material forming the template 16') and/or of the electrolyte. In one embodiment, the porous alumina template 16' may have up to about 15 wt % or up to about 18 wt % of electrolyte ions incorporated and/or absorbed/adsorbed therein.

It is to be understood that the volume of the tantalum pentoxide that grows during the anodization of the tantalum layer 14 should exceed the volume of the tantalum from which the oxide is formed so that the oxide squeezes into the pores 18 of the template 16' to form the nano-pillars 20. The orientation of the nano-pillars 20 is generally controlled by the orientation of the pores 18. In the example of the method depicted in the FIG. 1 series, the nano-pillars 20 are oriented in a position that is substantially normal to the substrate 12, and thus is substantially normal to the non-anodized portion of the flat tantalum layer 14 disposed on the substrate 12.

As shown in FIG. 1E, the tantalum layer 14 is anodized at an appropriate anodization voltage and/or current density for an amount of time sufficient for the tantalum pentoxide nano-pillars 20 to continue to grow, inside their respective pores 18, up to a predetermined height h. In an example, the tantalum pentoxide nano-pillars 20 grow until each nano-pillar 20 has substantially the same predefined length L that terminates at an end 21. As shown in FIG. 1E, the length L of the nano-pillars 20 is shorter than a height H of the pores 18 within which the nano-pillars 20 are grown. As soon as the nano-pillars 20 are grown to the predetermined height h (and thus each nano-pillar has the same length L), anodization stops, and the multi-layered stack 10 is removed from the electrolytic cell.

Figure 2B:
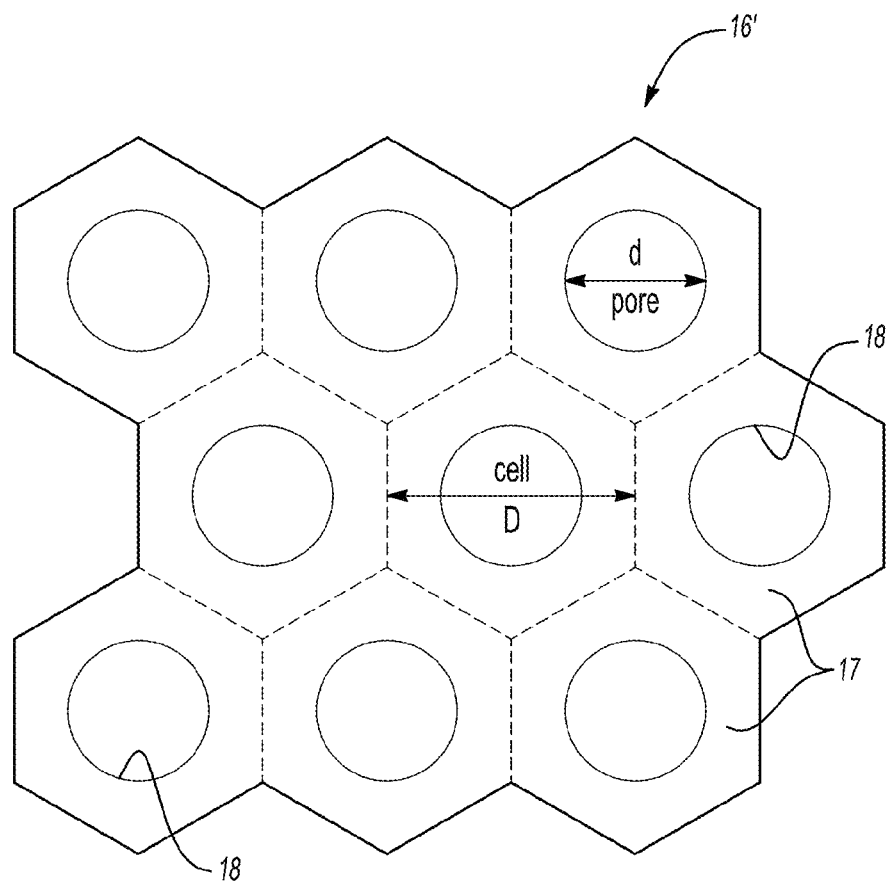
FIG. 2B is a top view of the example of the anodic alumina template of FIG. 2A.
Figure 2C:
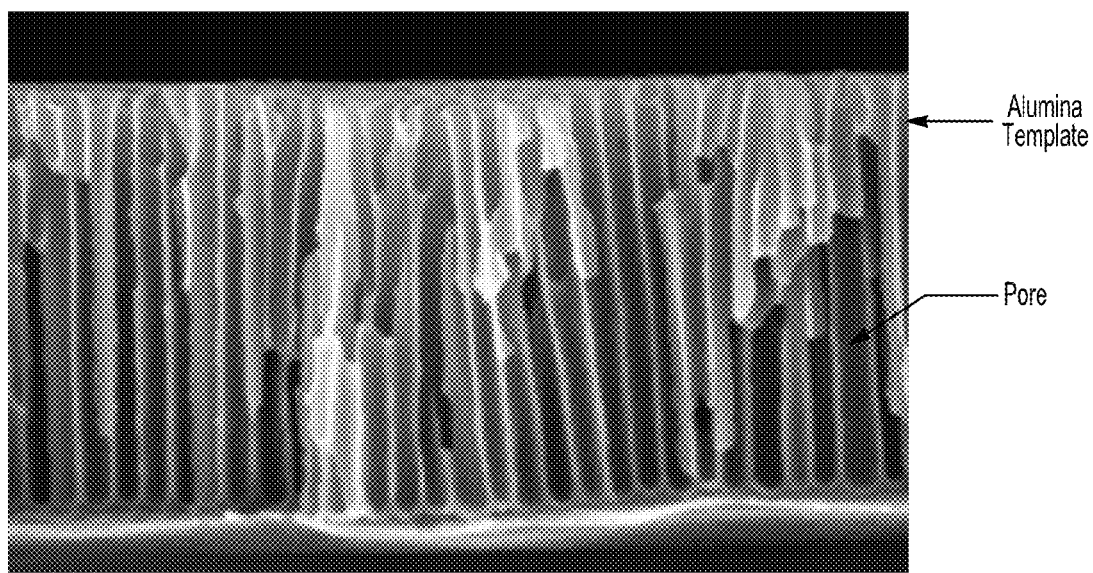
FIG. 2C is a scanning electron micrograph (SEM) image showing a cross section of an anodic alumina template after about 30 minutes of etching.

It is further to be understood that the configuration/ structure of the pores 18 may also dictate the geometry and/or dimensions of the individual nano-pillars 20. For instance, the template 16' may be formed so that the pores 18 have a uniform diameter, a uniform pitch, and a uniform height. When the nano-pillars 20 grow during the anodization, the geometry and/or dimensions of the nano-pillars 20 will conform to that of the pores 18 within which the nano-pillars 20 are growing. The geometry and/or dimensions of the nano-pillars 20 may further be controlled by adjusting one or more parameters of the oxidizing material anodization process. For instance, as illustrated in FIG. 2B, the pitch D of the nano-pillars 20 (which is equivalent to the cell 17 diameter of the anodic alumina template 16') will depend on the anodization voltage of the anodization process used to form the template 16'. The diameter d of the nano-pillars 20 (which is equivalent to the pore 18 diameter) will depend on the nature of the electrolyte selected and the current density used during the anodization of the aluminum layer 16 to form the template 16'. The diameter d may also depend upon the degree of anisotropic etching used to further refine and define the pores 18. As mentioned above, the height h of the nano-pillars 20 and the dense underlying $Ta_2O_5$ layer 14' is proportional to the anodization voltage applied to the tantalum layer 14 during its anodization. Other factors that affect the height of the nano-pillars 20 and the dense underlying $Ta_2O_5$ layer 14' include the duration of anodization at the anodization voltage, pore diameter, and possibly one or more other factors. As mentioned above, for growing a dense tantalum pentoxide film, about 1.8 nm of the oxide grows per one volt, and for growing nano-pillars with a dense underlying tantalum pentoxide layer and/or a cap layer, from about 1.3 nm to about 1.8 nm of the oxide grows per one volt. Other dimensions that may be derived from the pitch D, the diameter d, and the height h include the gap between the nano-pillars 20 (i.e., D−d=gap) and the aspect ratio (i.e., h/d=aspect ratio) of the nano-pillars 20. In an example, the nano-pillars 20 have i) a pitch D ranging from about 30 nm to about 500 nm, ii) a diameter d ranging from about 10 nm to about 350 nm, and iii) a height h ranging from greater than 10 nm to about 1000 nm. In another example, the gap between adjacent nano-pillars 20 ranges from about 0 nm (i.e., where the nano-pillars 20 physically touch each other) to about 300 nm.

The dimensions of the nano-pillars 20 may be used to determine the flexibility of the micro-structure 100, and thus its usefulness as a shock absorber. In one example, the micro-structure 100 is considered to be flexible when its individual nano-pillars 20 have an aspect ratio that is equal to or exceeds about 7. It is to be understood that more force may be required to bend nano-pillars 20 with an aspect ratio of 7 than may be required to bend nano-pillars 20 with an aspect ratio greater than 10 (which are flexible enough to bend under their own weight). In another example, the micro-structure shown in the SEM images of FIGS. 4A through 4D (which includes nano-pillars having a diameter of about 65 nm and a gap between adjacent nano-pillars of about 105 nm) is less flexible than the micro-structure shown in the SEM images of FIGS. 5A through 5D (which includes nano-pillars having a diameter of about 30 nm and a gap between adjacent nano-pillars of about 50 nm). Further, the micro-structure depicted in the SEM images of FIGS. 6A through 6D (which includes nano-pillars having a diameter of about 17 nm and a gap between adjacent nano-pillars of about 25 nm) is more flexible than either of the micro-structures shown in the FIGS. 4 and 5 series. The nano-pillars shown in FIGS. 6A through 6D have an aspect ratio about 12, and are flexible enough to be bent under their own weight.

After the nano-pillars 20 are grown, a portion of the template 16' defining the pores 18 is removed, leaving behind a remaining portion of the template 16' that is substantially planar with the nano-pillars 20 formed in the pores 18, as shown in FIG. 1F. In one embodiment, the excessive portion of the template 16' (i.e., the portion that is not filled with the grown nano-pillars 20) is removed. In another embodiment, a portion of the template 16' and portions of the nano-pillars 20 are removed (e.g., from about 5 nm to about 10 nm of nano-pillar height). Removal is accomplished via chemical mechanical polishing (CMP), which planarizes the respective ends 21 of the individual nano-pillars 20, as well as respective ends 25 of the template 16' to form a substantially even plane 23. By "a substantially even plane", it is meant that the ends 21 of the nano-pillars 20 and the ends 25 of the remaining template 16' line up to form a flat/smooth plane. It is to be understood that the plane may be substantially even when the plane is flat, but may also contain some irregularities.

In an embodiment, a material is deposited on at least a portion of the substantially even plane 23 to form a film layer 22 thereon, as shown in FIG. 1G. This film layer 22 is formed to have a predetermined thickness t. In an example, the thickness t of the film layer 22 ranges from the diameter of the nano-pillars 20 (as small as 10 nm) up to 1000 nm. It is to be understood that the thickness t depends, at least in part, upon the density of the material used to form the film layer 22. When a lighter material is used, a thicker layer 22 may be deposited. In one embodiment, the thickness t ranges from about 10 nm to about 5 μm, or even greater if the material is light. In another embodiment, the thickness t ranges from about 20 nm to about 500 nm.

The selection of the material of the film layer 22 depends upon the application of the micro-structure 100, and may be used, for example, to determine the chemical, mechanical, optical, magnetic, piezoelectric, and/or ferroelectric properties of the micro-structure 100. For instance, if piezoelectric properties are desired and/or required, the material selected for the film layer 22 may be zinc oxide (ZnO), aluminum nitride (AlN), lead zirconate titanate (PZT), or another piezoceramic material. When these materials are used, it is to be understood that electrodes are also incorporated into the micro-structure 100. The electrodes could be deposited to sandwich the film layer 22 or could be deposited as inter-digitated electrodes on the top of film layer 22. More generally, the material for the film layer 22 may be selected from oxides, nitrides, metals, composite materials (cermets), polymers, composites based on monomers or polymers (e.g., monomers or polymers with oxides, metals, particles, nano-wires, nano-crystals, carbon nano-tubes, etc.). In an example, a single material may be deposited on the plane 23 to form a single film layer 22, or two or more different materials may be deposited in discrete portions to form a single film layer 22 on the plane 23, or two or more different materials may be stacked to form a multi-layered structure (e.g., two or more layers). In instances where the film layer 22 includes multiple stacked layers, the layers may be deposited directly one on top of the other, or may include an adhesive layer disposed between each layer. For example, the first layer may be selected to provide adhesion to the $Ta_2O_5$ pillars 20 and chemical stability to withstand chemical etching of the alumina template 16', and the second layer may be selected to provide mechanical properties (toughness, micro-hardness, weight, etc.) to the micro-structure 100. The inclusion of multiple layers can, in some instances, give the micro-structure 100 additional properties (e.g., chemical stability, reflectivity (when position change is detected using light reflection), etc.) that a single layer alone may not be able to achieve. Other examples of the materials suitable for forming the single or multi-layered film layer 22 include SiN, TiN, $SiO_2$, $Al_2O_3$ (not amorphous anodic alumina, just ordinary alumina which is chemically more robust), $Ta_2O_5$, $HfO_2$, Al, Au, W, Pt, Pd, etc. In an embodiment when a noble metal is used, it may be desirable to include a thin layer (e.g., up to 5 nm) of an adhesion layer (e.g., Ta, Cr, Ti, etc.) between the noble metal and the planar surface 23.

Deposition of the material on the plane 23 may be accomplished using any suitable deposition technique known in the art. Some examples of deposition techniques that may be used include different variations of chemical vapor deposition (CVD), physical vapor deposition (PVD) (such as, e.g., sputtering, co-sputtering, reactive sputtering or co-sputtering, thermal evaporation, pulsed laser deposition), atomic layer deposition (ALD), spin-coating (in some instances in combination with curing via UV and/or temperature, e.g., when monomers are used), chemical solution deposition (CSD), plating, electroplating, etc.

Referring now to FIG. 1H, in an embodiment, the film layer 22 alone is selectively patterned to remove a portion of the film layer 22 from the substantially even plane 23, leaving a remaining portion of the film layer 22' behind. It is to be understood that, in the embodiment of the method described in conjunction with FIGS. 1A through 1I, the remaining film layer 22' covers a designated set of nano-pillars 20, however all of the nano-pillars 20 remain after patterning. The portion of the film layer 22' left behind is a micro-island or, in instances where the micro-cluster 24' (shown in FIG. 1I) is also referred to as a multi-legged table structure, the remaining film layer 22' can be referred to as a table top surface. As shown in FIG. 1H, the micro-island 22' covers the designated set of nano-pillars 20, and the combination of the micro-island 22' and the set of nano-pillars 20 with the alumina template 16' still positioned between the nano-pillars 20 is referred to herein as a pre-micro-cluster 24. It is to be understood that the pre-micro-cluster 24 is a precursor to the micro-cluster 24' shown in FIG. 1I.

In an example, patterning of the film layer 22 may be accomplished using any selective patterning process such as, e.g., a standard photolithography process. In one embodiment, patterning is performed to remove desired portion(s) of the film layer 22 to form the micro-island 22' while leaving the underlying template 16' and nano-pillars 20 in tact (moving from FIG. 1G to FIG. 1H). In another embodiment, patterning is performed such that the template 16' is etched during the patterning of the film layer 22. In this embodiment, the method moves from FIG. 1G directly to FIG. 1I. This embodiment may also require the use of multiple etchants simultaneously.

Referring now to FIG. 1H, in one embodiment, once the pre-micro-cluster(s) 24 is/are formed (and the template 16' has not yet been removed), the method further includes selectively removing any remaining portion(s) of the template 16'. In an example, the template 16' is removed using a selective etching process that will remove the anodic alumina template 16' without deleteriously affecting the other features (e.g., 14', 20, 22'). Selective etching may be accomplished using an etchant solution (such as, e.g., $H_3PO_4$—$CrO_3$—$H_2O$) solution) at a temperature ranging from about 80° C. to about 95° C. It is to be understood that etching may also be accomplished at a temperature outside of the foregoing range, but the duration of the etching may be affected. For instance, at a temperature lower than 80° C., the duration of the etching may be longer. In some cases, etching may also be accomplished at temperatures as high as the boiling point of the solution (such as, e.g., about 100° C.). In this embodiment, $H_3PO_4$ etches the alumina and the $CrO_3$ passivates aluminum etching (this is particularly desirable when working with patterned aluminum and localized alumina). In one example, the etchant solution includes about 92 g of $H_3PO_4$, about 32 g of $CrO_3$, and about 200 g of $H_2O$, although it is to be understood that the components of the etchant may vary. It has been found that the nano-pillars 20 can withstand this particular etching process for more than one hour, while the anodic alumina template 16' is etched away at a rate of about 1 micron per minute. Other etching solutions that may be used include hydroxide solutions such as, e.g., NaOH, KOH, etc. The alumina template 16' may also be etched using a 5% $H_3PO_4$ solution at 30° C., $H_2SO_4$, etc. Etching may be accomplished, e.g., in a lateral direction to a distance of about 100 μm, and in some instances even further. The resultant micro-structure 100 after removing the template 16' is shown in FIG. 1I, which includes i) one or more micro-clusters 24', and ii) one or more free-standing nano-pillars 20.

The micro-structure 100 shown in FIG. 1I includes free standing nano-pillars 20 (i.e., not covered by the layer 22'), which, in some applications, can bend and absorb energy of acoustic waves. The surface of the micro-cluster 24' has a much larger surface area than the free-standing nano-pillars 20. This surface can catch more energy than the free-standing nano-pillars 20, which can be transferred to the underlying nano-pillars 20. When the micro-structure 100 is used as filter, the layer 22' creates protection and closure for the underlying pillars 20 such that solution or gas can be directed laterally from one side and the filtrate will exit the structure 100 laterally from another side. In another embodiment, the free-standing nano-pillars 20 may be used to further filter out large particulates, and the liquid of interest may be collected under the film layer 22' for further processing (e.g., sensing, concentration, processing, or the like).

As stated above, another embodiment of the method for forming another embodiment of the micro-structure 100' is schematically depicted in FIGS. 1A through 1G, 1J, and 1K. In this embodiment, after the film layer 22 is deposited on the substantially even plane 23 (as shown in FIG. 1G), the method further includes patterning some of the nano-pillars 20, some of the film layer 22, some of the template 16', and, in some cases, some of the layer 14' to form a pre-micro-island 24, shown in FIG. 1J. In contrast to the embodiment described above in conjunction with FIGS. 1A through 1I, some of the nano-pillars 20 are removed so that the remaining nano-pillars 20 are part of the pre-micro-island 24. As shown in FIG. 1J, the remaining film layer 22' covers the set of nano-pillars 20 and the remaining template 16' alone. Any suitable patterning and removal process may be used to remove the desired portions of the nano-pillars 20, the film layer 22, the template 16', and the underlying structure 14'. In one example, standard photolithography, wet or dry etching, or laser ablation is used to remove the desired portions of the components 20, 22, 16', 14' leaving the pre-micro-cluster 24. Any of these processes may use a photoresist or a hard mask to achieve selectively. It is to be understood that in some embodiments, portions of the remaining Ta layer 14 may also be removed. In another example, SiN, $Si_xN_y$, or $SiNH_4$ hard mask may be used for patterning, and then the desired portions of the components 20, 22, 16', 14' may be etched away.

Once the pre-micro-cluster 24 is formed, the method further includes selectively removing any remaining portion of the template 16', as shown in FIG. 1K. This may be accomplished using the process(es) previously described in reference to FIG. 1I. In this embodiment, the removal of the template 16' forms the micro-cluster 24'. The resultant micro-structure 100' shown in FIG. 1K includes the micro-cluster 24' without any free-standing nano-pillars 20.

Figure 7:
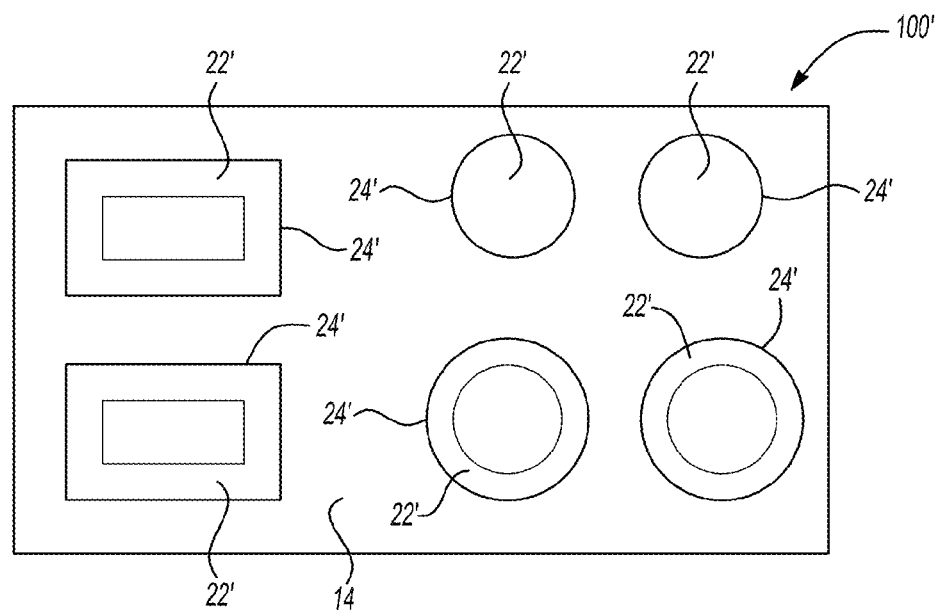
FIG. 7 is a top view schematically depicting an example of a micro-structure formed according to the embodiment of the method described in conjunction with FIGS. 1A through 1G, 1J, and 1K.

It is to be understood that although a single micro-cluster 24' is shown in FIGS. 1J and 1K, the processes described above may be used to form a plurality of micro-clusters 24'. For instance, the patterning/removal process may be used to remove particular groupings of the film layer 22 (for forming the structure 100) or particular groupings of nano-pillars 20, film layer 22 established thereon, and any template 16' and layer 14' located therebetween or therebeneath (for forming the structure 100') to form isolated pre-micro-islands 24. When the remaining template 16' is removed from these pre-micro-clusters 24, multiple isolated micro-clusters 24' will be formed on the flat tantalum layer 14, which is disposed on the substrate 12. A top view of the micro-structure 100' including a plurality of micro-clusters 24' is schematically shown in FIG. 7. As shown in FIG. 7, the film layer 22' and/or the micro-clusters 24' may be circularly shaped, rectangularly shaped, donut shaped, frame shaped, and/or have any other desirable geometric shape.

It is to be understood that, in some cases, it may be desirable to modify the surface chemistry of the nano-pillars 20 and/or of the nano-island 22', for example, to improve the chemical robustness/stability of the micro-structure 100, 100', to tune the contact angle of these surfaces in order to improve wettability or to stop wetting, to change the acidity of zeta potential of these surfaces so that the surfaces may have a different affinity to different chemicals, to alter the catalytic properties, etc. Modification of the surface chemistry may be accomplished, for example, by depositing a material on a surface of the nano-pillars 20 and/or the micro-island 22'. Deposition of the material may be accomplished, for example, by atomic layer deposition, chemical vapor deposition, metal organic chemical vapor deposition (MOCVD), electrochemical deposition, and/or the like. In an example, the material may be conformally deposited over the entire surface of the selected nano-pillars 20 and/or the micro-island 22' at a thickness ranging from about 4 nm to about 8 nm. In another example, the thickness of the deposited layer is about 6 nm. Some examples of the materials that may be deposited on the nano-pillars 20 and/or the nano-island 22' include aluminum oxide, zirconium oxide, titanium oxide, silicon dioxide, tungsten oxide, zinc oxide, hafnium oxide, or combinations thereof. Monolayers of special coatings, such as hydrophobic coatings, may also be deposited on the resulting micro-structures 100, 100'.

Figure 9:
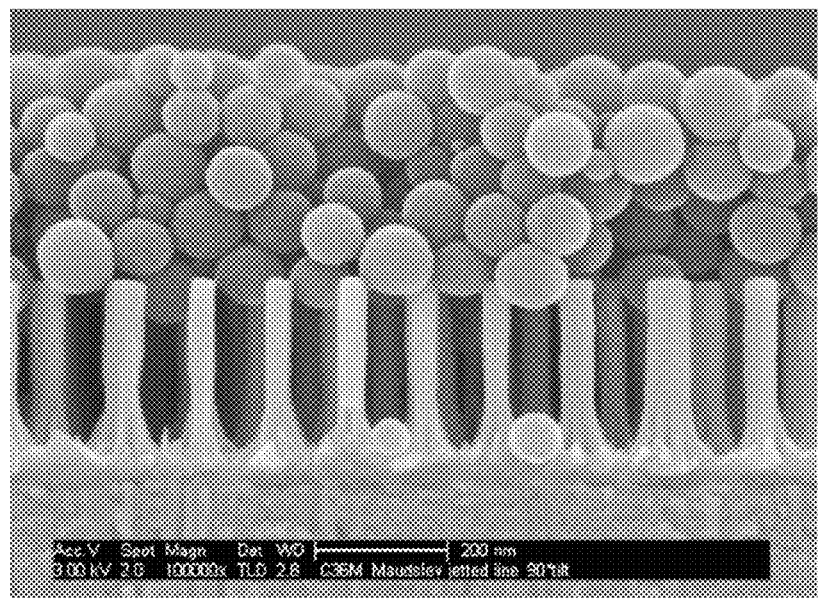
FIG. 9 is a SEM image of an example of a micro-structure being used as a filter for latex ink particles.

In an embodiment, the micro-structures disclosed herein may include at least one opening 30 defined in the micro-island 22' (i.e., the remaining portion of the film layer 22 left over after patterning as shown in FIGS. 1H and 1J). An embodiment of this micro-structure 100" is shown schematically in FIG. 8. The opening(s) 30 may be formed as part of the patterning process of the layer 22. The opening(s) 30 may be used, for example, as an entrance for fluidic media for micro- or nano-filtration, such as to deliver small quantities of a reagent for testing or screening. Any particles 32 of the fluidic media that are larger than the diameter of the opening(s) 30 cannot pass through the opening 30, whereas the particles that are small enough to enter the opening(s) 30 will pass through and travel under the micro-island 22' (and perhaps into the gaps formed between the nano-pillars 20 of the micro-cluster 24' as shown in FIG. 8). An example of a micro-structure being used as a nano-filter for vertical filteration/separation of latex ink particles is shown in the SEM image in FIG. 9 (where the micro-island 22' is not shown).

Any embodiment of the micro-structure disclosed herein may be used as a filter for lateral filtration of liquids and gases. One embodiment of such a structure 100''' is shown in FIG. 10. FIG. 10 illustrates micro-clusters 24' similar to those shown in FIG. 1K, with a gap between the clusters 24'. This type of structure 100''' may be formed by etching away the opening 34 after the partial template removal process is performed (i.e., after CMP is performed), filling the opening 34 with a sacrificial layer, depositing layer 22, and then removing the sacrificial layer and the template 16'. FIG. 10 schematically depicts the nano-structure 100''' as a nano-filter for gases, whereby a gas stream (identified by arrows in the figure and labeled "Air") is directed to flow laterally through the nano-pillars 20. Particulates (e.g., particles, cells, colloid particles, etc.) or other matter larger than the spaces between the nano-pillars 20 are selectively removed from the gas stream and are not able to pass through to the sensor. This filter may advantageously be used in combination with the sensor (schematically shown in FIG. 10) so that the sensor is exposed to the desirable components of the gas stream alone.

In some cases, it may also be desirable to control the mass of the micro-island 22'. For instance, the micro-structures 100, 100', 100'', 100''' may include an array of micro-clusters 24' having respective micro-islands 22' of different masses. In an example, the mass of the micro-island 22' may be controlled by adjusting the thickness of the micro-island 22' and/or the lateral area of the micro-island 22'.

While several embodiments have been described in detail, it will be apparent to those skilled in the art that the disclosed embodiments may be modified. Therefore, the foregoing description is to be considered non-limiting.

What is claimed is:

1. A micro-structure, consisting of:
    a substrate;
    a non-oxidized portion of an oxidizable material layer formed on the substrate;
    an oxide layer formed on the non-oxidized portion and from the oxidizable material layer;
    metal oxide nano-pillars extending from the oxide layer and formed from the oxidizable material layer, wherein each of the plurality of nano-pillars has a length that terminates at an end such that the plurality of nano-pillars ends, together, defines a substantially even plane oriented in a position that is opposed to the substrate;
    an empty space separating each nano-pillar from each adjacent nano-pillar; and
    a film layer formed on at least a portion of the substantially even plane.

2. The micro-structure as defined in claim 1 wherein:
    the oxidizable material is chosen from tantalum, tungsten, niobium, and titanium;
    the non-oxidized portion of the oxidizable material is tantalum when the oxidizable material is tantalum, tungsten when the oxidizable material is tungsten, niobium when the oxidizable material is niobium, or titanium when the oxidizable material is titanium; and
    the oxide layer and the metal oxide nano-pillars are tantalum pentoxide when the oxidizable material is tantalum, tungsten oxide when the oxidizable material is tungsten, niobium oxide when the oxidizable material is niobium, or titanium oxide when the oxidizable material is titanium.

3. The micro-structure as defined in claim 1 wherein each of the plurality of metal oxide nano-pillars includes a pitch ranging from about 30 nm to about 500 nm, a diameter ranging from about 10 nm to about 350 nm, a height ranging from about 10 nm to about 1000 nm, and an aspect ratio that is greater than 10.

4. The micro-structure as defined in claim 1 wherein the film layer includes a surface modified by a material chosen from aluminum oxide, zirconium oxide, titanium dioxide, silicon dioxide, tungsten oxide, zinc oxide, hafnium oxide, and combinations thereof.

5. The micro-structure as defined in claim 1 wherein the micro-structure includes at least one micro-cluster having a portion of the film layer and a portion of the plurality of metal oxide nano-pillars.

6. The micro-structure as defined in claim 1 wherein the film layer includes at least one opening defined therein.

7. The micro-structure as defined in claim 1 wherein each of the plurality of metal oxide nano-pillars is uniform in at least one of diameter, pitch, or height.

8. The micro-structure as defined in claim 1 wherein the film layer is selected from the group consisting of zinc oxide, aluminum nitride, and lead zirconate titanate.

9. The micro-structure as defined in claim 8, further comprising inter-digitated electrodes formed on the film layer.

10. The micro-structure as defined in claim 1 wherein the substrate is selected from the group consisting of silicon, silicon having an insulating layer thereon, glass, quartz, stainless steel, plastic, and combinations thereof.

11. The micro-structure as defined in claim 1 wherein the nano-pillars comprise an amorphous oxide material.

12. The micro-structure as defined in claim 1 wherein the film layer has a thickness ranging in size from about 10 nm to about 5 μm.

13. The micro-structure as defined in claim 1 wherein the film layer has a thickness ranging in size from about 20 nm to about 500 nm.

* * * * *